US012713935B2

(12) United States Patent
Park et al.

(10) Patent No.: US 12,713,935 B2
(45) Date of Patent: Aug. 18, 2026

(54) SEMICONDUCTOR DEVICES COMPRISING FIRST TO THIRD OVERLAY STRUCTURES PENETRATING THROUGH FIRST TO THIRD MOLD STRUCTURES ON OVERLAY MARK REGION AND DATA STORAGE SYSTEMS INCLUDING THE SAME

(71) Applicant: Samsung Electronics Co., Ltd., Suwon-si (KR)

(72) Inventors: Junseok Park, Suwon-si (KR); Seunghak Park, Suwon-si (KR); Chan Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 18/489,354

(22) Filed: Oct. 18, 2023

(65) Prior Publication Data

US 2024/0234332 A1 Jul. 11, 2024

(30) Foreign Application Priority Data

Jan. 10, 2023 (KR) ........................ 10-2023-0003597

(51) Int. Cl.

| | |
|---|---|
| ***H10B 43/27*** | (2023.01) |
| ***H10B 41/27*** | (2023.01) |
| ***H10B 41/40*** | (2023.01) |
| ***H10B 43/40*** | (2023.01) |
| ***H10B 43/50*** | (2023.01) |
| ***H10W 46/00*** | (2026.01) |

(52) U.S. Cl.
CPC ............ *H10W 46/00* (2026.01); *H10B 41/27* (2023.02); *H10B 41/40* (2023.02); *H10B 43/27* (2023.02); *H10B 43/40* (2023.02); *H10B 43/50* (2023.02)

(58) Field of Classification Search
None
See application file for complete search history.

(56) References Cited

U.S. PATENT DOCUMENTS 8,143,731 B2 3/2012 Chiu
8,592,107 B2 11/2013 Huang et al.
(Continued)

FOREIGN PATENT DOCUMENTS

KR 10-2006-0071013 A 6/2006
KR 10-2006-0110940 A 10/2006
KR 10-2014-0132405 A 11/2014

*Primary Examiner* — Daniel Whalen

(74) *Attorney, Agent, or Firm* — Harness, Dickey & Pierce, P.L.C.

(57) ABSTRACT

A semiconductor device includes a first stack structure in a first region, a first channel structure in contact with the substrate, a second stack structure on the first stack structure, a second channel structure connected to the first channel structure, a third stack structure on the second stack structure, a third channel structure connected to the second channel structure, a first mold structure in a second region, first overlay structures on the first mold structure, a second mold structure on the first mold structure, second overlay structures on the second mold structure, a third mold structure on the second mold structure, and third overlay structures on the third mold structure, wherein the first to third overlay structures are on an overlay mark region, and the first to third overlay structures are in at least one of quadrants in the overlay mark region.

20 Claims, 25 Drawing Sheets

(56) References Cited

U.S. PATENT DOCUMENTS

| | | | | |
|---|---|---|---|---|
| 9,136,223 | B2 | 9/2015 | Ning et al. | |
| 10,527,954 | B2 | 1/2020 | Kandel et al. | |
| 2005/0094145 | A1 | 5/2005 | Lin | |
| 2006/0131576 | A1 | 6/2006 | Koh et al. | |
| 2019/0115303 | A1 | 4/2019 | Chen et al. | |
| 2023/0240073 | A1 * | 7/2023 | Son | H10B 41/40 |
| 2024/0145400 | A1 * | 5/2024 | Kim | H10B 43/27 |

* cited by examiner

100

GS1
GS2
GS3
KS1
KS2
KS3
CH
CH1
CH2
CH3
KC
KC1
KC2
KC3
R1
R2
SS
MS
US
'A'
105
170
103
155
190
125
130
120
104
102
101
119A
119B
119C
118
110
I
I'
II
II'
X
Y
Z

SEMICONDUCTOR DEVICES COMPRISING FIRST TO THIRD OVERLAY STRUCTURES PENETRATING THROUGH FIRST TO THIRD MOLD STRUCTURES ON OVERLAY MARK REGION AND DATA STORAGE SYSTEMS INCLUDING THE SAME

CROSS-REFERENCE TO RELATED APPLICATION(S)

This application claims the benefit of priority to Korean Patent Application No. 10-2023-0003597 filed on Jan. 10, 2023 in the Korean Intellectual Property Office, the disclosure of which is hereby incorporated by reference in its entirety.

BACKGROUND

Example embodiments of the present disclosure relate to semiconductor devices and/or a data storage system including the same.

A semiconductor device capable of storing high-capacity data in a data storage system requiring data storage has been necessary. Accordingly, a method for increasing data storage capacity of a semiconductor device has been researched. For example, as a method for increasing data storage capacity of a semiconductor device, a semiconductor device including memory cells disposed three-dimensionally, instead of memory cells disposed two-dimensionally, has been suggested.

SUMMARY

Some example embodiments of the present disclosure provide semiconductor devices having improved integration density and reliability.

Some example embodiments of the present disclosure provide data storage systems including a semiconductor device having improved integration density and reliability.

According to an example embodiment of the present disclosure, a semiconductor device includes a substrate having first and second regions, a first stack structure including first gate electrodes stacked and spaced apart from each other in a vertical direction perpendicular to an upper surface of the substrate in the first region, a first channel structure penetrating through the first stack structure and in contact with the substrate, a second stack structure on the first stack structure and the first channel structure and including second gate electrodes stacked and spaced apart from each other in the vertical direction, a second channel structure penetrating through the second stack structure and connected to the first channel structure, a third stack structure on the second stack structure and the second channel structure and including third gate electrodes stacked and spaced apart from each other in the vertical direction, a third channel structure penetrating through the third stack structure and connected to the second channel structure, a first mold structure including first horizontal sacrificial layers stacked and spaced apart from each other in the vertical direction in the second region, first overlay structures penetrating through at least a portion of the first mold structure, a second mold structure on the first mold structure and the first overlay structures and including second horizontal sacrificial layers stacked and spaced apart from each other in the vertical direction, second overlay structures penetrating through at least a portion of the second mold structure, a third mold structure on the second mold structure and the second overlay structures and including third horizontal sacrificial layers stacked and spaced apart from each other in the vertical direction, and third overlay structures penetrating through at least a portion of the third mold structure, wherein the first to third overlay structures are in first to third mold structures, respectively, and are on an overlay mark region, and wherein, in the overlay mark region, the first to third overlay structures are in at least one of quadrants defined by a first direction parallel to the upper surface of the substrate and a second direction parallel to the upper surface of the substrate and intersecting the first direction.

According to an example embodiment of the present disclosure, a semiconductor device includes a substrate having first and second regions, a first stack structure including first gate electrodes stacked and spaced apart from each other in a vertical direction perpendicular to an upper surface of the substrate in the first region, a first channel structure penetrating through the first stack structure and in contact with the substrate, a second stack structure on the first stack structure and the first channel structure and including second gate electrodes stacked and spaced apart from each other in the vertical direction, a second channel structure penetrating through the second stack structure and connected to the first channel structure, a third stack structure on the second stack structure and the second channel structure and including third gate electrodes stacked and spaced apart from each other in the vertical direction, a third channel structure penetrating through the third stack structure and connected to the second channel structure, a first mold structure including first horizontal sacrificial layers stacked and spaced apart from each other in the vertical direction in the second region, first overlay structures penetrating through at least a portion of the first mold structure, a second mold structure on the first mold structure and the first overlay structures and including second horizontal sacrificial layers stacked and spaced apart from each other in the vertical direction, second overlay structures penetrating through at least a portion of the second mold structure, a third mold structure on the second mold structure and the second overlay structures and including third horizontal sacrificial layers stacked and spaced apart from each other in the vertical direction, and third overlay structures penetrating through at least a portion of the third mold structure, wherein the first to third overlay structures are in first to third mold structures, respectively, and are on an overlay mark region, and are in at least one quadrant with respect to a central point of the overlay mark region, wherein a portion of the first overlay structures extends in a first direction parallel to the upper surface of the substrate, and the other portion of the first overlay structures extends in the first direction and a second direction perpendicular to the vertical direction, wherein a portion of the second overlay structures extends in the first direction, and the other portion of the second overlay structures extends in the second direction, and wherein a portion of the third overlay structures extends in the first direction, and the other portion of the third overlay structures extends in the second direction.

According to an example embodiment of the present disclosure, a data storage system includes a semiconductor storage device including a substrate having first and second regions, circuit devices on one side of the substrate, and input/output pad electrically connected to the circuit devices, and a controller electrically connected to the semiconductor storage device through the input/output pad and configured to control the semiconductor storage device, wherein the semiconductor storage device includes a first stack structure including first gate electrodes stacked and spaced apart from each other in a vertical direction perpendicular to an upper surface of the substrate in the first region, a first channel structure penetrating through the first stack structure and in contact with the substrate, a second stack structure on the first stack structure and the first channel structure and including second gate electrodes stacked and spaced apart from each other in the vertical direction, a second channel structure penetrating through the second stack structure and connected to the first channel structure, a third stack structure on the second stack structure and the second channel structure and including third gate electrodes stacked and spaced apart from each other in the vertical direction, a third channel structure penetrating through the third stack structure and connected to the second channel structure, a first mold structure including first horizontal sacrificial layers stacked and spaced apart from each other in the vertical direction in the second region, first overlay structures penetrating through at least a portion of the first mold structure, a second mold structure on the first mold structure and the first overlay structures and including second horizontal sacrificial layers stacked and spaced apart from each other in the vertical direction, second overlay structures penetrating through at least a portion of the second mold structure, a third mold structure on the second mold structure and the second overlay structures and including third horizontal sacrificial layers stacked and spaced apart from each other in the vertical direction, and third overlay structures penetrating through at least a portion of the third mold structure, wherein the first to third overlay structures are in first to third mold structures, respectively, and wherein the first to third overlay structures are disposed in at least one of quadrants defined by a first direction parallel to the upper surface of the substrate and a second direction parallel to the upper surface of the substrate and intersecting the first direction.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, some example embodiments of the present disclosure will be described as follows with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
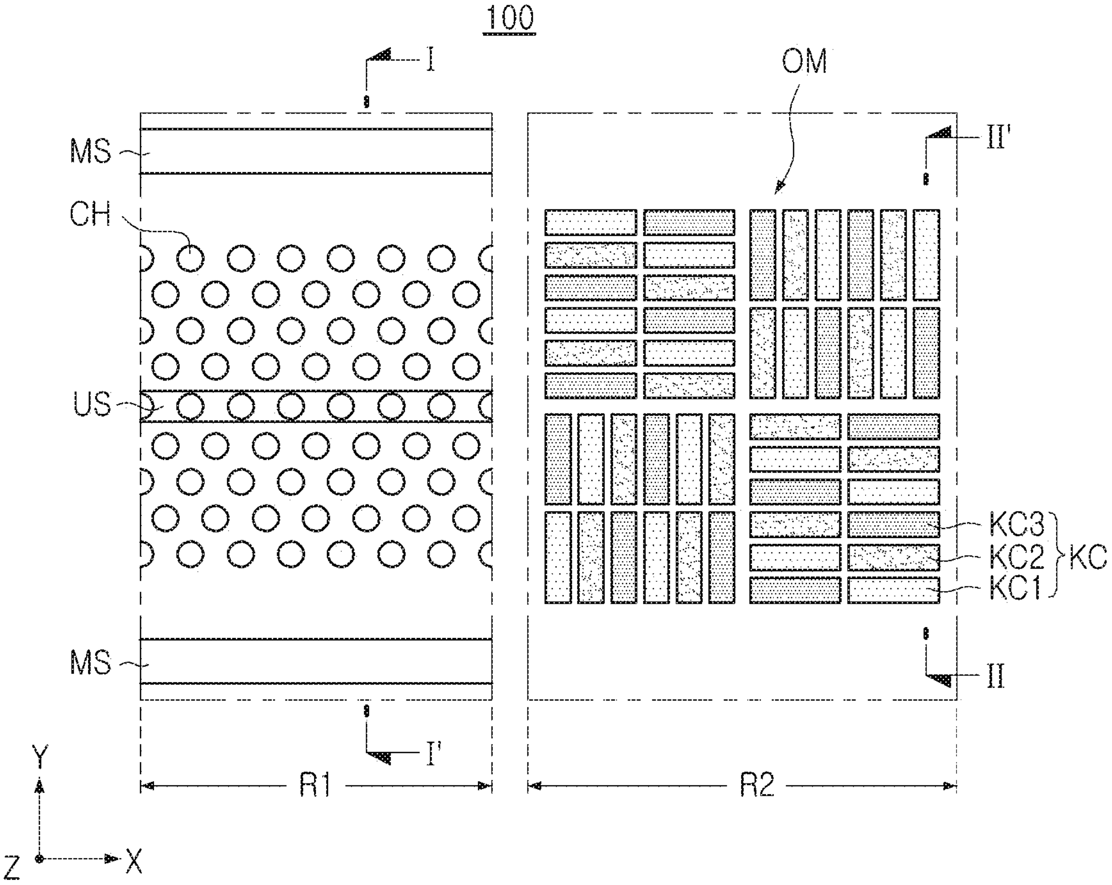
FIG. 1A is a plan diagram illustrating a semiconductor device according to an example embodiment of the present disclosure.

FIG. 1A is a plan diagram illustrating a semiconductor device according to an example embodiment.

Figure 1B:
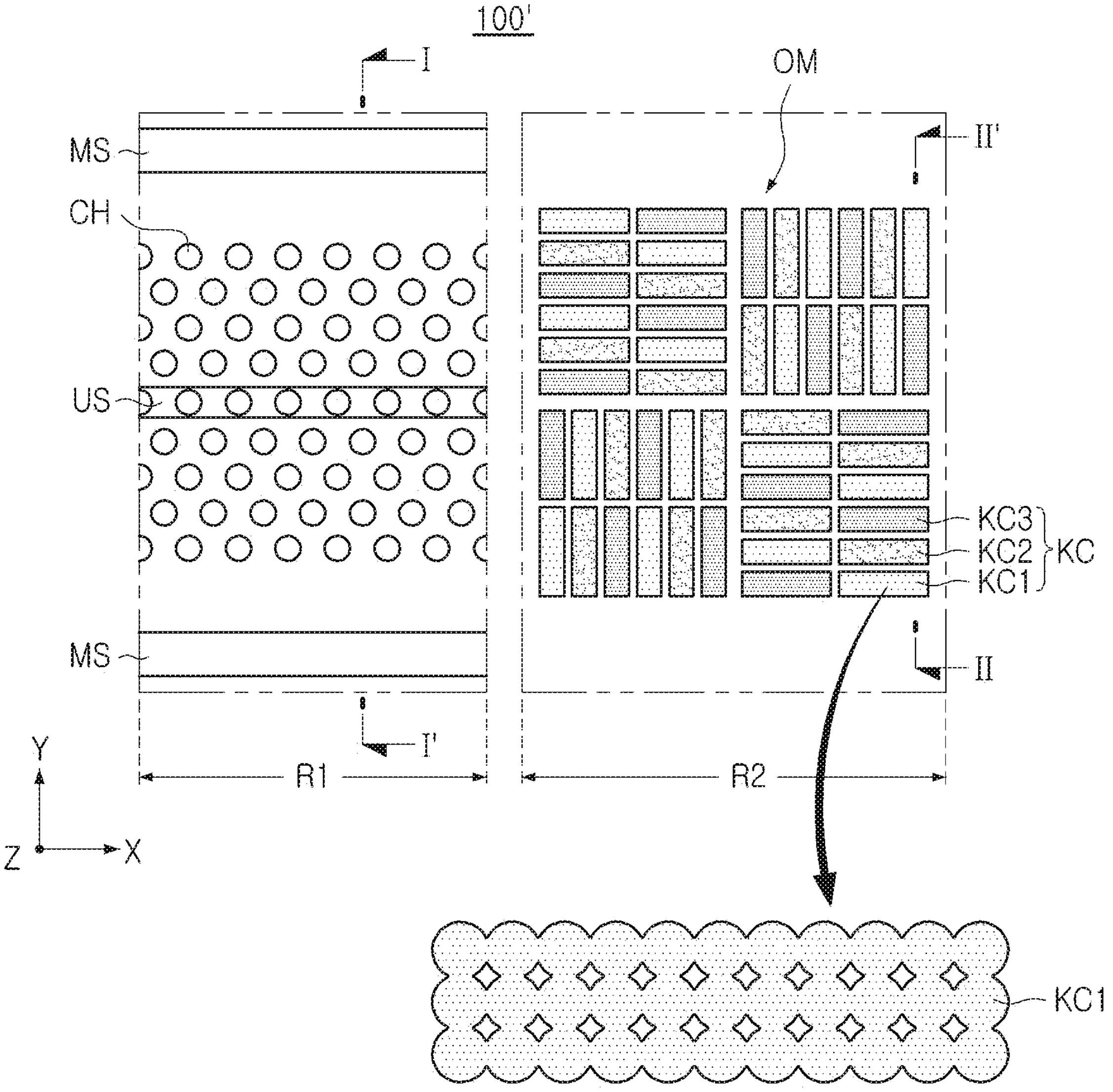
FIG. 1B is a plan diagram illustrating a semiconductor device according to an example embodiment of the present disclosure.

FIG. 1B is a plan diagram illustrating a semiconductor device according to an example embodiment.

Figure 2A:
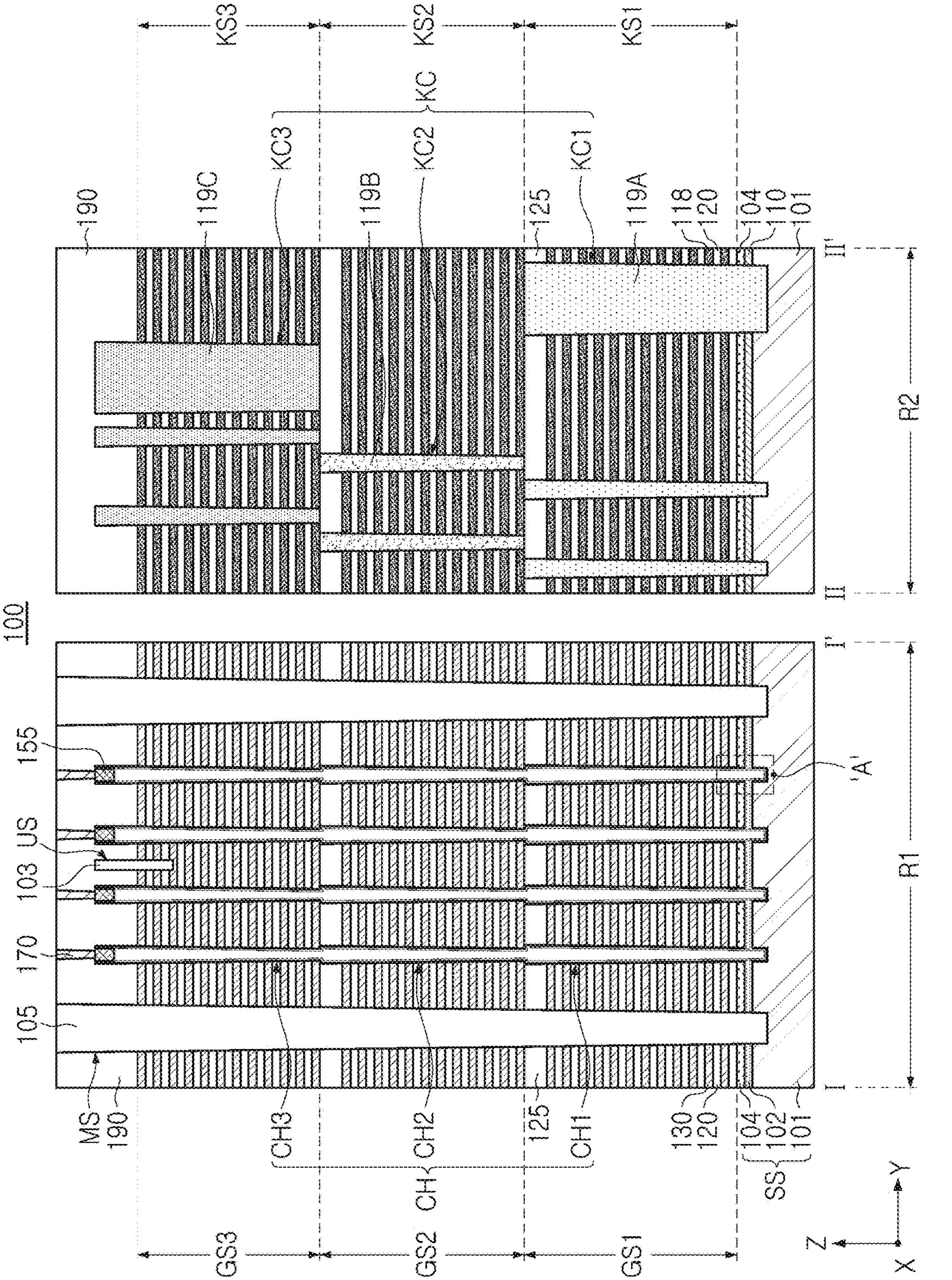
FIG. 2A is a cross-sectional diagram illustrating a semiconductor device according to an example embodiment of the present disclosure.

FIG. 2A is a cross-sectional diagram illustrating a semiconductor device according to an example embodiment, taken along lines I-I' and II-II' in FIG. 1A.

Figure 2B:
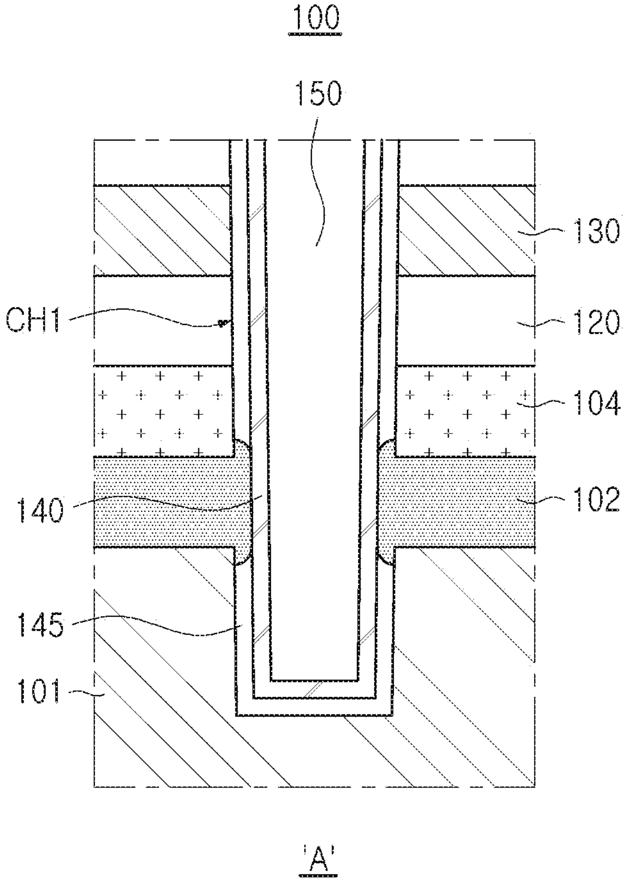
FIG. 2B is an enlarged diagram illustrating a partial region of a semiconductor device according to an example embodiment of the present disclosure.

FIG. 2B is an enlarged diagram illustrating a partial region of a semiconductor device according to an example embodiment, illustrating region "A" in FIG. 2A.

Referring to FIGS. 1A to 2B, a semiconductor device 100 may include a substrate 101 having first and second regions R1 and R2.

In first region R1, the semiconductor device 100 may include first to third stack structures GS1, GS2, and GS3 each including first and second horizontal conductive layers 102 and 104, gate electrodes 130 and interlayer insulating layers 120 on substrate 101, channel structures CH penetrating through the first to third stack structures GS1, GS2, and GS3 and each including a channel layer 140, upper isolation regions US penetrating through a portion of third stack structure GS3, isolation regions MS extending by penetrating through the first to third stack structures GS1, GS2, and GS3, contact plugs 170 on the channel structures CH, and a cell region insulating layer 190 covering the first to third stack structures GS1, GS2, and GS3.

In the second region R2, the semiconductor device 100 may include at least one overlay mark region OM. In the second region R2, the semiconductor device 100 may include a horizontal insulating layer 110 on the substrate 101, a second horizontal conductive layer 104 on the horizontal insulating layer 110, first to third mold structures KS1, KS2, KS3 each including horizontal sacrificial layers 118 and interlayer insulating layers 120, first overlay structures KC1 penetrating through the first mold structure KS1, second overlay structures KC2 penetrating through the second mold structure KS2, third overlay structures KC3 penetrating through the third mold structure KS3, and a cell region insulating layer 190 covering the first to third mold structures KS1, KS2, KS3.

In the semiconductor device 100, in the first region R1, the memory cell strings including memory cells may be disposed around the channel structures CH, and the second region R2 may be disposed on the external side of first region R1, and memory cells may not be disposed in the second region R2. For example, the semiconductor device 100 may further include a peripheral circuit region including circuit devices for applying electrical signals to memory cells of the first region R1, and the second region R2 may be disposed on one side of the peripheral circuit region or may be a dummy region disposed on the external side of the peripheral circuit region. In some example embodiments, the second region R2 may be disposed on a scribe lane between memory chip regions. In this case, a portion of the second region R2 may remain in the semiconductor device 100 after dicing. The semiconductor device 100 may be a semiconductor structure before dicing.

The substrate 101 may have an upper surface extending in a first direction X parallel to the upper surface of the substrate 101 and a second direction Y parallel to the upper surface of the substrate 101 and perpendicular to the first direction X. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator layer (SOI), or a semiconductor on insulator layer (SeOI).

The first and second regions R1 and R2 of the substrate 101 may be spaced apart from each other. In this disclosure, for ease of description, the first and second regions R1 and R2 may be referred to as regions of the substrate 101, or the first and second regions R1 and R2 may be referred to as regions of the semiconductor device 100.

The first and second horizontal conductive layers 102 and 104 may be stacked in order on the upper surface of the first region R1 of the substrate 101. The first and second horizontal conductive layers 102 and 104 together with the substrate 101 may form the source structure SS. The source structure SS may function as a common source line of the semiconductor device 100. As illustrated in the enlarged diagram in FIG. 2B, the first horizontal conductive layer 102 may be directly connected to the channel layer 140 around the channel layer 140.

The first and second horizontal conductive layers 102 and 104 may include a semiconductor material, such as polycrystalline silicon. In this case, at least the first horizontal conductive layer 102 may be doped with impurities having the same conductivity as that of the substrate 101. The second horizontal conductive layer 104 may be a doped layer or an intrinsic semiconductor layer including impurities diffused from the first horizontal conductive layer 102. However, the material of the second horizontal conductive layer 104 is not limited to a semiconductor material, and may be replaced with an insulating layer in some example embodiments. In some other example embodiments, a relatively thin insulating layer may be interposed between the first horizontal conductive layer 102 and the second horizontal conductive layer 104.

The horizontal insulating layer 110 may be disposed on the substrate 101 on the same level as a level of the first horizontal conductive layer 102 in the second region R2. The horizontal insulating layer 110 may include a plurality of insulating layers alternately stacked on the substrate 101. The horizontal insulating layer 110 may be layers remaining after a portion of the horizontal insulating layer 110 is replaced with the first horizontal conductive layer 102 in the process of manufacturing the semiconductor device 100. The horizontal insulating layer 110 may include at least one of silicon oxide, silicon nitride, silicon carbide, and silicon oxynitride.

The first to third stack structures GS1, GS2, and GS3 may be stacked in order from the substrate 101 in a vertical direction Z perpendicular to the upper surface of the substrate 101. Each of the first to third stack structures GS1, GS2, and GS3 may include gate electrodes 130 and interlayer insulating layers 120 alternately disposed with the gate electrodes 130. The first and second stack structures GS1 and GS2 may further include an upper interlayer insulating layer 125 disposed in an uppermost portion and having a relatively thick thickness.

The gate electrodes 130 may be vertically spaced apart from each other on the substrate 101 in the first region R1 and may form the first to third stack structures GS1, GS2, and GS3. Gate electrodes 130 of the first stack structure GS1 may be referred to as first gate electrodes, gate electrodes 130 of the second stack structure GS2 may be referred to as second gate electrodes, and gate electrodes 130 of the third stack structure GS3 may be referred to as third gate electrodes.

Among the gate electrodes 130, at least one gate electrode 130 including the lowermost gate electrode 130 may form a ground select transistor, and at least one gate electrode 130 including the uppermost portion of the gate electrode 130 may form a string select transistor. The other gate electrodes 130 may form a plurality of memory cells, and the number of gate electrodes 130 included in the memory cells may be determined according to capacity of the semiconductor device 100. In some example embodiments, one or more of the gate electrodes 130 disposed above the string select transistor and/or below the ground select transistor may form an erase transistor used for an erase operation using a gate induced drain leakage (GIDL) phenomenon. Further, a portion of gate electrodes 130, for example, some gate electrodes 130 above and/or below the gate electrodes 130 included in memory cells may be dummy gate electrodes.

The gate electrodes 130 may be isolated from each other in a desired (or alternatively, predetermined) unit in the Y-direction by the isolation regions MS. The gate electrodes 130 between a pair of the isolation regions MS may form a memory block, but example embodiments of the memory block are not limited thereto.

The gate electrodes 130 may include a metal material, such as tungsten (W). In some example embodiments, the gate electrodes 130 may include polycrystalline silicon or a metal silicide material. In some other example embodiments, the gate electrodes 130 may further include a diffusion barrier. For example, the diffusion barrier may include tungsten nitride (WN), tantalum nitride (TaN), titanium nitride (TiN), or a combination thereof.

The interlayer insulating layers 120 may be disposed between the gate electrodes 130 in the first region R1 and may be disposed between the horizontal sacrificial layers 118 in the second region R2. Similar to the gate electrodes 130 and the horizontal sacrificial layers 118, the interlayer insulating layers 120 may also be spaced apart from each other in a direction perpendicular to the upper surface of the substrate 101 and may be disposed to extend in the X-direction.

Upper interlayer insulating layers 125 having a relatively thick thickness may be disposed between the first to third stack structures GS1, GS2, and GS3 and between the first to third mold structures KS1, KS2, and KS3 to be described later.

The interlayer insulating layers 120 and upper interlayer insulating layers 125 may include an insulating material such as silicon oxide or silicon nitride.

The channel structures CH may form a memory cell string, and may be spaced apart from each other while forming rows and columns in the first region R1. The channel structures CH may be disposed to form a lattice pattern on the X-Y plane or may be disposed in a zigzag pattern in one direction. The channel structures CH may have a column shape and may have an inclined side surface having a width decreasing toward the substrate 101 depending on an aspect ratio.

The channel structures CH may include vertically stacked first to third channel structures CH1, CH2, and CH3. The first channel structures CH1 may penetrate through first stack structure GS1 and may be in contact with the substrate 101, the second channel structures CH2 may penetrate through the second stack structure GS2 and may be connected to the first channel structures CH1, and the third channel structures CH3 may penetrate through the third stack structure GS3 and may be connected to the second channel structures CH2. The channel structures CH may have a bent portion formed by a difference in width in a region in which the first channel structures CH1 and the second channel structures CH2 are connected to each other and in a region in which the second channel structures CH2 and the third channel structures CH3 are connected to each other. However, in example embodiments, the number of channel structures stacked in the Z-direction may vary.

Each of the channel structures CH may include a gate dielectric layer 145, a channel layer 140, a channel buried insulating layer 150, and a channel pad 155 disposed in order in a channel hole. The channel layer 140, the gate dielectric layer 145, and the channel buried insulating layer 150 may be connected to each other between the first channel structure CH1 and the second channel structure CH2.

As illustrated in the enlarged diagram in FIG. 2B, the channel layer 140 may be formed in an annular shape surrounding the internal channel buried insulating layer 150, but in example embodiments, the channel layer 140 may have a cylindrical shape or a prism shape without the channel buried insulating layer 150. The channel layer 140 may be connected to the first horizontal conductive layer 102 at a lower portion thereof. The channel layer 140 may include a semiconductor material such as polycrystalline silicon or monocrystalline silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130.

The channel pad 155 may be disposed only on an upper end of the upper third channel structure CH3. The channel pad 155 may include, for example, doped polycrystalline silicon.

The isolation regions MS may penetrate through the first to third stack structures GS1, GS2, and GS3 and the first and second horizontal conductive layers 102 and 104, may extend in the X-direction by in first region R1, and may be connected to substrate 101. As illustrated in FIG. 1A, the isolation regions MS may be disposed parallel to each other. The isolation regions MS may isolate the gate electrodes 130 from each other in the Y-direction. The isolation regions MS may have a shape in which a width thereof may decrease toward the substrate 101 due to a high aspect ratio. The isolation regions MS may include an isolation insulating layer 105 disposed in the trench. The isolation insulating layer 105 may include an insulating material, for example, silicon oxide, silicon nitride, or silicon oxynitride.

The upper isolation regions US may extend in the X-direction between isolation regions MS adjacent to each other in the Y-direction in the first region R1, as illustrated in FIG. 1A. The upper isolation regions US may be disposed to penetrate through a portion of uppermost ones of the third gate electrodes GS3 among the gate electrodes 130. The upper isolation regions US may isolate, for example, three uppermost gate electrodes 130 from each other in the Y-direction, as illustrated in FIG. 2A. However, the number of gate electrodes 130 isolated by upper isolation regions US may vary depending on example embodiments. The upper isolation region US may include an upper insulating layer 103. The upper isolation insulating layer 103 may include an insulating material, for example, silicon oxide, silicon nitride, or silicon oxynitride.

The contact plugs 170 may be disposed on channel structures CH in the first region R1. The contact plugs 170 may have a cylindrical shape and may have an inclined side surface such that a width thereof may decrease toward the substrate 101 depending on an aspect ratio. The contact plugs 170 may electrically connect the channel structures CH to an upper interconnection structure such as bit lines. The contact plugs 170 may not be disposed in the second region R2. The contact plugs 170 may be formed of a conductive material, and may include, for example, at least one of tungsten (W), aluminum (Al), and copper (Cu).

The overlay mark regions OM may include first to third overlay structures KC1, KC2, and KC3 disposed in a square region and disposed in the first to third mold structures KS1, KS2, and KS3.

The overlay mark regions OM may be used to identify whether the upper and lower patterns on the substrate 101 are formed and accurately aligned in a photolithography process, in an overlay process of measuring alignment of the first to third stack structures GS1, GS2, and GS3 on substrate 101 and detecting defects in the process of manufacturing the semiconductor device 100. For example, to measure the alignment of each of the first to third channel structures CH1, CH2, and CH3, by forming the first overlay structures KC1 in first mold structure KS1, the second overlay structures KC2 in second mold structure KS2, and the overlay third structures KC3 in the third mold structure KS3, and comparing positions of the first to third overlay structures KC1, KC2, and KC3, the alignment state may be measured. The overlay mark regions OM may be formed in a form such as an advanced imaging metrology AIM mark, but example embodiments thereof are not limited thereto. In the process of manufacturing the semiconductor device 100, when it is desired to identify the alignment of multiple stack structures GS in addition to the first to third stack structures GS1, GS2, and GS3, overlay structures KC may need as many as the number of stack structures GS to be aligned. When a plurality of overlay structures KC are formed to have respective overlay mark region OMs, the second region R2, that is, the area of the scribe lane may increase. To reduce the area of the second region R2 and efficiently use the space of the second region R2, the alignment state of three or more stack structures GS may be measured at once by using the overlay mark regions OM of the disclosed example embodiment. Accordingly, a semiconductor device 100 having improved integration and reliability may be provided.

However, the number of overlay mark regions OM, the shape and size of patterns formed by first to third overlay structures KC1, KC2, and KC3 in each of the overlay mark regions OM may vary in some example embodiments. In some example embodiments, in the semiconductor device 100, only a portion of regions of the overlay mark regions OM may remain.

The first to third mold structures KS1, KS2, and KS3 may be stacked in order from the substrate 101 in the Z-direction in the second region R. Each of the first to third mold structures KS1, KS2, and KS3 may include horizontal sacrificial layers 118 and interlayer insulating layers 120 alternately arranged with horizontal sacrificial layers 118. The first and second mold structures KS1 and KS2 may further include an upper interlayer insulating layer 125 disposed in an uppermost portion and having a relatively thick thickness. Depending on example embodiments, the number of the stack structures and the mold structures stacked in the Z-direction may vary, and accordingly, the shape of the overlay structures KC may also vary.

The first mold structure KS1 may be disposed on the same level as a level of the first stack structure GS1 in at least a region, the second mold structure KS2 may be disposed on the same level as a level of the second stack structure GS2 in at least a region, and the third mold structure KS3 may be disposed on the same level as a level of the third stack structure GS3 in at least a region. The level of first mold structure KS1 may overlap the level of first stack structure GS1, the level of second mold structure KS2 may overlap the level of second stack structure GS2, and the level of third mold structure KS3 may overlap the level of third stack structure GS3.

The horizontal sacrificial layers 118 may be vertically stacked and spaced apart from each other on the substrate 101 in the second region R2 and may form the first to third mold structures KS1, KS2, and KS3. The horizontal sacrificial layers 118 of the first mold structure KS1 may be referred to as the first horizontal sacrificial layers, the horizontal sacrificial layers 118 of the second mold structure KS2 may be referred to as the second horizontal sacrificial layers, and the horizontal sacrificial layers 118 of the third mold structure KS3 may be referred to as third horizontal sacrificial layers. The horizontal sacrificial layers 118 may have the same thickness as that of the gate electrodes 130.

In the first mold structure KS1, the horizontal sacrificial layers 118 may be disposed on the same or substantially similar level as a level of the gate electrodes 130 of the first stack structure GS1. The number of stacked horizontal sacrificial layers 118 included in the first mold structure KS1 may be the same as or substantially similar to the number of stacked gate electrodes 130 included in the first stack structure GS1.

In the second mold structure KS2, the horizontal sacrificial layers 118 may be disposed on the same or substantially similar level as a level of the gate electrodes 130 of the second stack structure GS2. The number of stacked horizontal sacrificial layers 118 included in the second mold structure KS2 may be the same as or substantially similar to the number of stacked gate electrodes 130 included in the second stack structure GS2.

In the third mold structure KS3, the horizontal sacrificial layers 118 may be disposed on the same or substantially similar level as a level of the gate electrodes 130 of the third stack structure GS3. The number of stacked horizontal sacrificial layers 118 included in the third mold structure KS3 may be the same as or substantially similar to the number of stacked gate electrodes 130 included in the third stack structure GS3.

The horizontal sacrificial layers 118 may be formed of an insulating material different from that of the interlayer insulating layers 120. The horizontal sacrificial layers 118 may include, for example, silicon oxide, silicon nitride, or silicon oxynitride.

The overlay structures KC may include first to third overlay structures KC1, KC2, and KC3 vertically disposed and not overlapping each other. In other words, the first to third overlay structures KC1, KC2, and KC3 may be provided to be offset from each other in plan view (or when viewed from above).

The first to third overlay structures KC1, KC2, and KC3 may be disposed on corresponding ones of first to third mold structures KS1, KS2, and KS3, respectively, and may form an overlay mark region OM. In an example embodiment, the first overlay structures KC1 may be disposed in the first mold structure KS1. The second overlay structures KC2 may be disposed in the second mold structure KS2. The overlay third structures KC3 may be disposed in the third mold structure KS3. The first to third overlay structures KC1, KC2, and KC3 may be disposed such that the entirety of the first to third overlay structures KC1, KC2, and KC3 may be included in at least one of quadrants formed by the first direction X and the second direction Y in the overlay mark region OM. Hereinafter, some example embodiments will be described with respect to the quadrant.

The first overlay structures KC1 may be disposed on the same or substantially similar level as a level of the first channel structures CH1. The first overlay structures KC1 may penetrate through at least a portion of the first mold structure KS1 and may be in contact with the substrate 101.

The first overlay structures KC1 may be parallel to each other. The upper surfaces of the first overlay structures KC1 may be coplanar with the upper surfaces of the first channel structures CH1.

The first overlay structures KC1 may include a first vertical sacrificial layer 119A. The first vertical sacrificial layer 119A may include a carbon-based material. The first vertical sacrificial layer 119A may be formed of, for example, silicon nitride (SiN), silicon carbonized nitride (SiCN), silicon oxynitride (SiON), and an amorphous carbon layer (ACL), but example embodiments thereof are not limited thereto.

The second overlay structures KC2 may be disposed on the same or substantially similar level as a level of the second channel structures CH2. The second overlay structures KC2 may be disposed on the first mold structure KS1 and the first overlay structures KC1. The second overlay structures KC2 may penetrate through at least a portion of the second mold structure KS2. The second overlay structures KC2 may be parallel to each other. The upper surfaces of the second overlay structures KC2 may be coplanar with the upper surfaces of the second channel structures CH2.

The second overlay structures KC2 may include a second vertical sacrificial layer 119B. The second vertical sacrificial layer 119B may include a carbon-based material. The second vertical sacrificial layer 119B may be formed of, for example, silicon nitride (SiN), silicon carbonitride (SiCN), silicon oxynitride (SiON), and an amorphous carbon layer (ACL), but an example embodiment thereof is not limited thereto.

The third overlay structures KC3 may be disposed on the same or substantially similar level as a level of the third channel structures CH3. The overlay third structures KC3 may be disposed on the second mold structure KS2 and the second overlay structures KC2. The overlay third structures KC3 may penetrate through at least a portion of the third mold structure KS3. The overlay third structures KC3 may be parallel to each other. The upper surfaces of the overlay third structures KC3 may be coplanar with the upper surfaces of the third channel structures CH3.

The third overlay structures KC3 may include a third vertical sacrificial layer 119C. The third vertical sacrificial layer 119C may include a carbon-based material. The third vertical sacrificial layer 119C may be formed of, for example, silicon nitride (SiN), silicon carbonized nitride (SiCN), silicon oxynitride (SiON), and an amorphous carbon layer (ACL), but an example embodiment thereof is not limited thereto.

According to an example embodiment, the first to third overlay structures KC1, KC2, and KC3 may be spaced apart from each other in the X-direction and the Y-direction and may not vertically overlap each other when viewed in the z-direction. The first to third overlay structures KC1, KC2, and KC3 may be configured to be horizontally shifted while not being connected to each other.

According to an example embodiment, the upper surfaces of the first overlay structures KC1 may be disposed on the same level as a level of the lower surfaces of the second overlay structures KC2, and the upper surfaces of the second overlay structures KC2 may be disposed on the same level as a level of the lower surfaces of the third overlay structures KC3. That is, the level of the upper surfaces of the first overlay structures KC1 and the lower surfaces of the second overlay structures KC2 may be continuous, and the level of the upper surfaces of the second overlay structures KC2 and the lower surfaces of the third overlay structures KC3 may be continuous, but example embodiments thereof are not limited thereto.

The first to third overlay structures KC1, KC2, and KC3 may be disposed in the second region R2, and as illustrated in FIG. 1A, the first to third overlay structures KC1, KC2, and KC3 may be disposed in a desired (or alternatively, predetermined) pattern in the overlay mark regions OM. Each of the first to third overlay structures KC1, KC2, and KC3 may include a plurality of bars or slits disposed vertically and parallelly in a pinwheel shape in four quadrants formed by the first direction X and the second direction Y in a square region. However, example embodiments thereof are not limited thereto. According to an example embodiment, in the semiconductor device 100' in FIG. 1B, at least one of the first to third overlay structures KC1, KC2, and KC3 in the overlay mark regions OM may have a dot shape on a plan diagram, but example embodiments thereof are not limited thereto. For example, referring to the enlarged diagram of the first overlay structures KC1 in the fourth quadrant in FIG. 1B, the upper and lower surfaces of the first overlay structures KC1 may have a rounded shape, and the dot may have a shape corresponding to the channel structures CH, and the size of the dot may be the same as or similar to that of channel structures CH. The dot shape as described above may also be applied to the other example embodiments. The number of the first overlay structure KC1, the number of the second overlay structure KC2, and the number of the third overlay structure KC3 may be the same, but example embodiments thereof are not limited thereto. According to an example embodiment, the first to third overlay structures KC1, KC2, and KC3 may be alternately disposed in at least one quadrant as illustrated in FIG. 1A.

Each of the first to third overlay structures KC1, KC2, and KC3 may be disposed in a quadrant with respect to a central point of cartesian coordinates. Each of the first to third overlay structures KC1, KC2, and KC3 may be symmetrical in a diagonal direction with respect to the center point, but example embodiments thereof are not limited thereto. According to an example embodiment, a portion of the first overlay structures KC1 may extend in the first direction X, the other portion of the first overlay structures KC1 may extend in the first direction X and the second direction Y, and a portion of the second overlay structures KC2 may extend in the first direction X, the other portion of the second overlay structures KC2 may extend in the second direction Y, a portion of the third overlay structures KC3 may extend in first direction X, and the other portion of the third overlay structures KC3 may extend in second direction Y. For example, in the first quadrant, each of the first to third overlay structures KC1, KC2, and KC3 may extend in the first direction X, and in the quadrant adjacent to the first quadrant, each of the first to third overlay structures KC1, KC2, and KC3 may extend in the second direction Y. According to another example, in at least one quadrant, a portion of the first to third overlay structures KC1, KC2, and KC3 may extend in a first direction X, and the other portion of the first to third overlay structures KC1, KC2, and KC3 may extend in a second direction Y.

Accordingly, the first overlay structures KC1 may measure the degree of alignment in the X and Y-directions, the second overlay structures KC2 may measure the degree of alignment in the X and Y-directions and the degree of alignment in the X and Y-directions.

Accordingly, the first to third overlay structures KC1, KC2, and KC3 may be formed on the first to third mold structures KS1, KS2, and KS3 disposed on different levels, respectively, and may measure the degree of alignment in the X and Y-directions such that the alignments of three or more stack structures GS may be measured at once in the overlay process.

The cell region insulating layer 190 may be disposed to cover the first to third stack structures GS1, GS2, and GS3 and the first to third mold structures KS1, KS2, and KS3. The cell region insulating layer 190 may include a plurality of insulating layers depending on some example embodiments. The cell region insulating layer 190 may be formed of an insulating material, and may include, for example, at least one of silicon oxide, silicon nitride, and silicon oxynitride.

In the description of some example embodiments below, descriptions overlapping those of the example embodiments in FIGS. 1A and 2B will not be provided.

Figure 3:
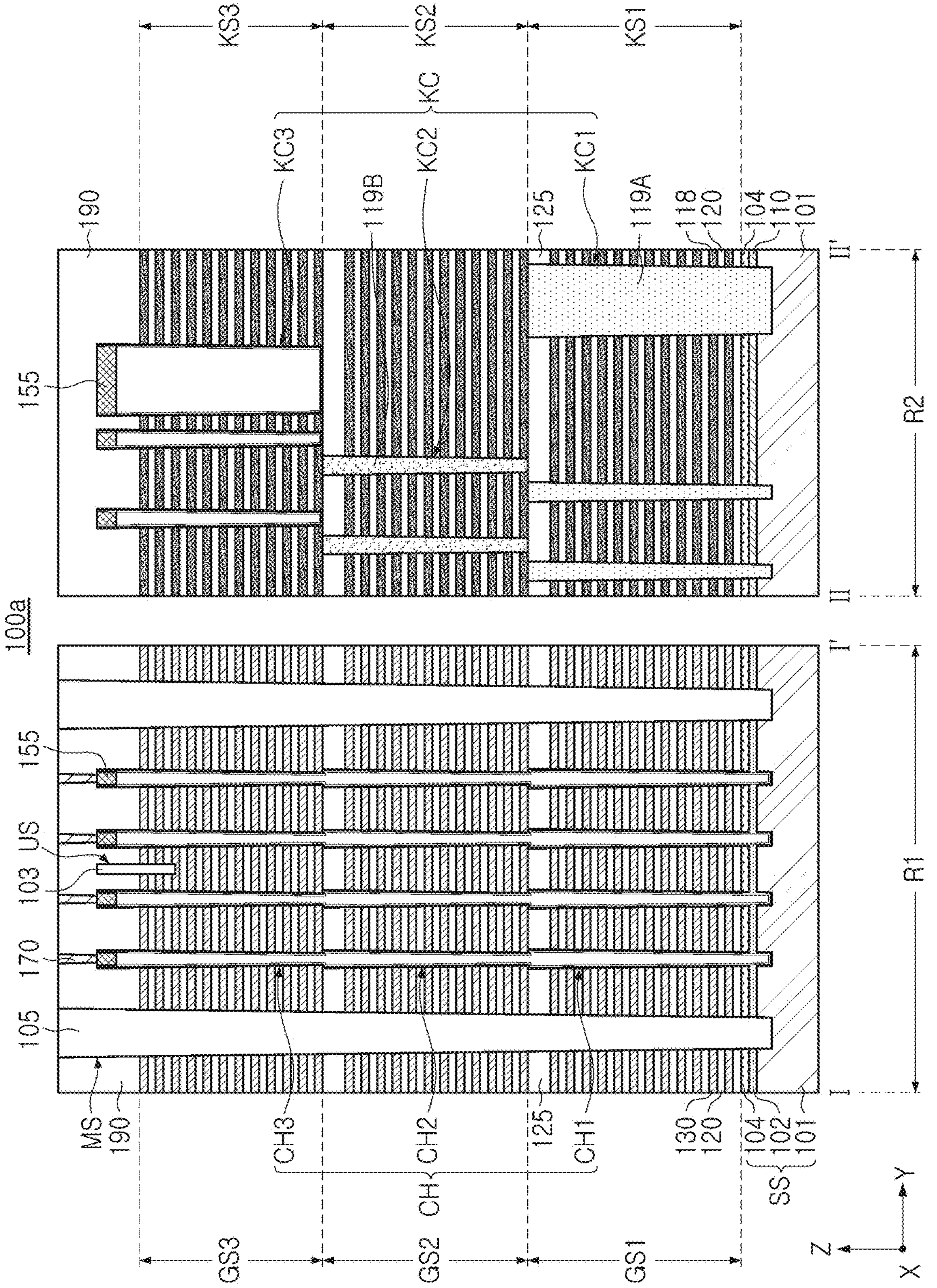
FIG. 3 is a cross-sectional diagram illustrating a semiconductor device according to an example embodiment of the present disclosure.

FIG. 3 is a cross-sectional diagram illustrating a semiconductor device according to an example embodiment.

Referring to FIG. 3, differently from the other example embodiments, in the semiconductor device 100*a*, the overlay structures KC may have the same internal structure as that of the channel structure CH. The configuration in which the internal structures are the same may indicate that the types of the layers disposed therein and the stacking order thereof may be the same. Accordingly, the overlay structures KC may include a gate dielectric layer 145, a channel layer 140, a channel buried insulating layer 150, and a channel pad 155 disposed in order in an opening. However, differently from the channel structure CH, the overlay structures KC may not receive an electrical signal from the contact plug 170 or may not form a memory cell string, such that the overlay structures KC may also be referred to as dummy channel structures. In some example embodiments, the overlay structures KC may function to identify the alignment of stack structures during the process of manufacturing the semiconductor device 100*a*.

Figure 4A:
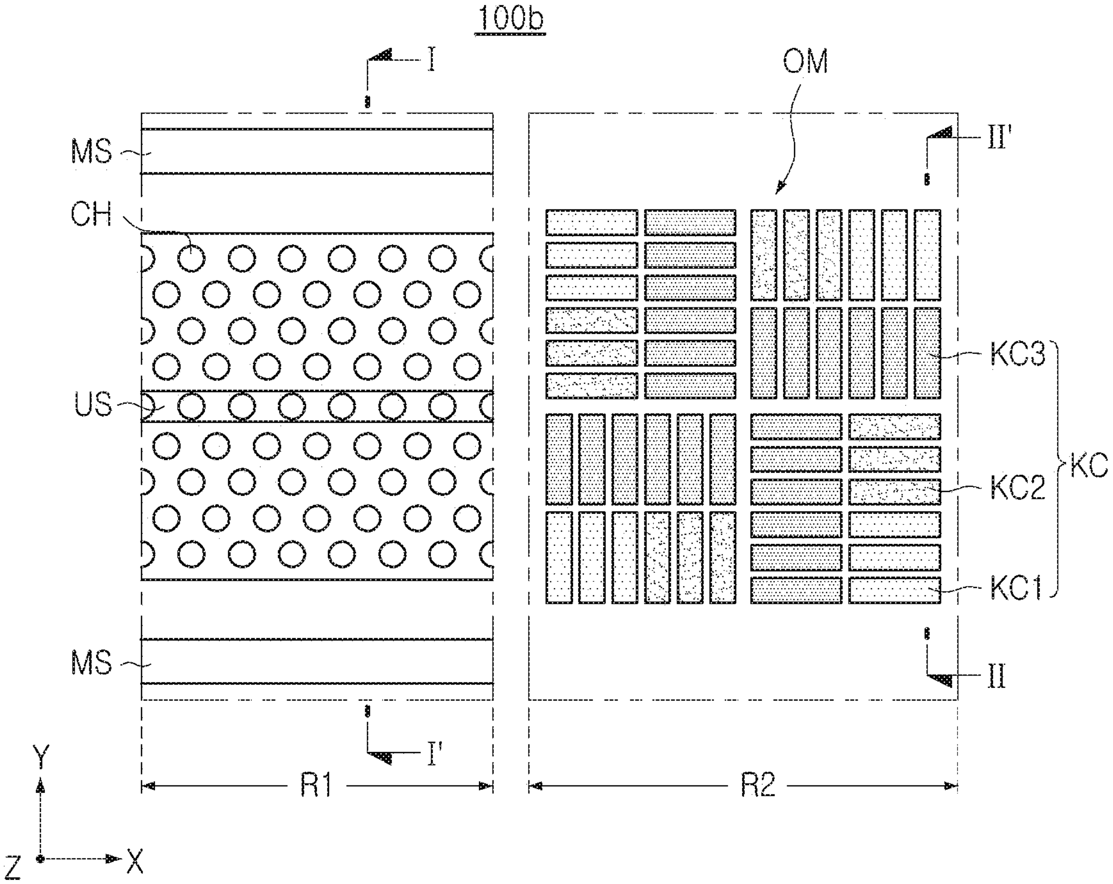
FIG. 4A is a plan diagram illustrating a semiconductor device according to an example embodiment of the present disclosure.

FIG. 4A is a plan diagram illustrating a semiconductor device according to an example embodiment.

Figure 4B:
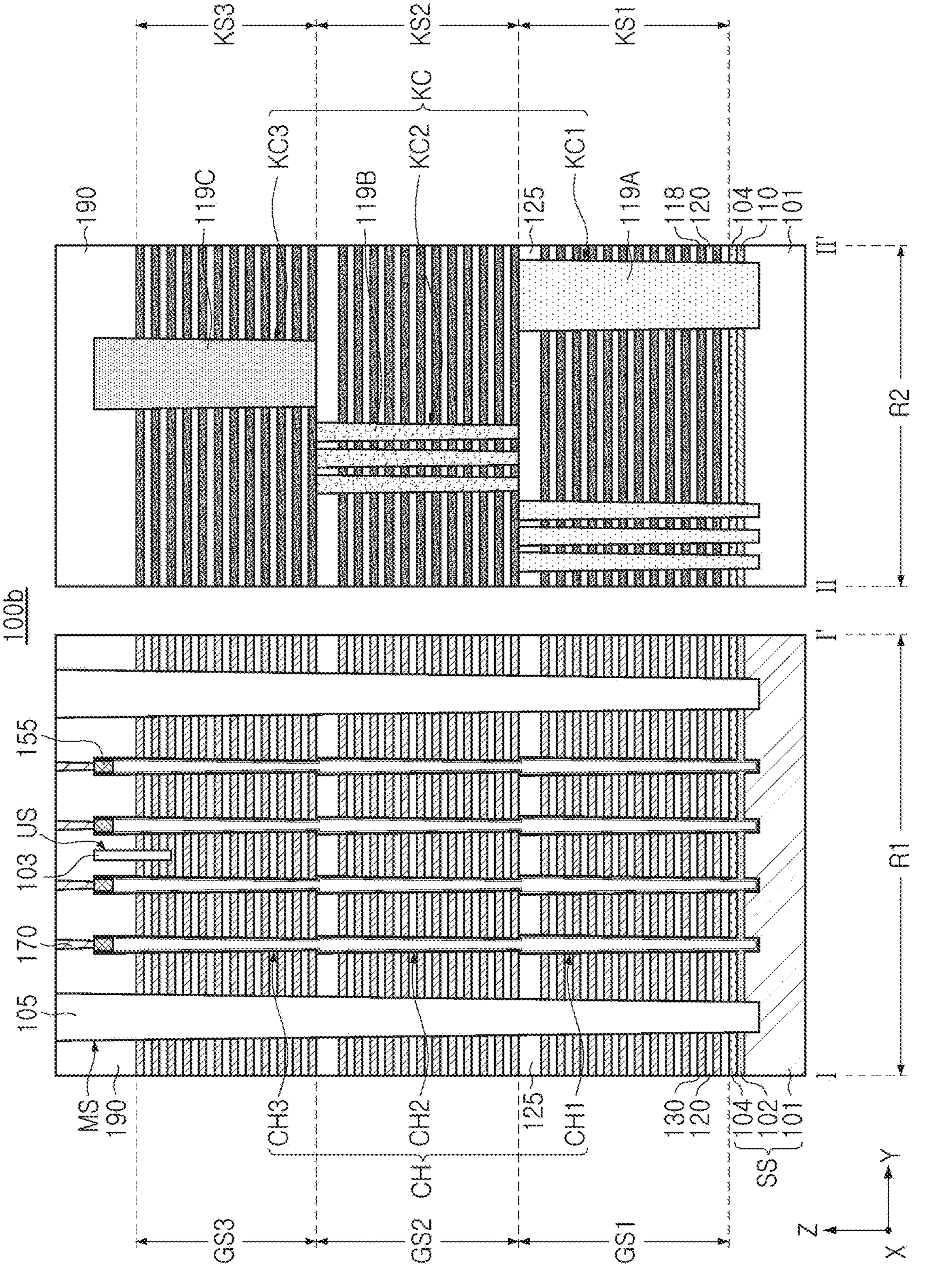
FIG. 4B is a cross-sectional diagram illustrating a semiconductor device according to an example embodiment of the present disclosure.

FIG. 4B is a cross-sectional diagram illustrating a semiconductor device according to an example embodiment, taken along lines I-I' and II-II' in FIG. 4A.

Referring to FIGS. 4A and 4B, in at least one quadrant, the first to third overlay structures KC1, KC2, and KC3 may be spaced apart from each other by the same distance therebetween in the semiconductor device 100*b*. For example, in the first quadrant, the first distance, which is the minimum horizontal distance between the first overlay structures KC1 parallel to each other, may be substantially equal to the second distance, which is the minimum horizontal distance between the second overlay structures KC2 running parallel to each other and the third distance, which is the minimum horizontal distance between the third overlay structures KC3 parallel to each other.

According to an example embodiment, the first to third overlay structures KC1, KC2, and KC3 in a quadrant as illustrated in FIG. 4A may not be alternately disposed and may be disposed consecutively. Even in this case, the overlay mark regions OM may measure the alignments of the first to third overlay structures KC1, KC2, and KC3 in the X-direction and Y-direction, respectively, such that the alignment state of three or more stack structures GS may be measured at once in the overlay process.

Figure 5A:
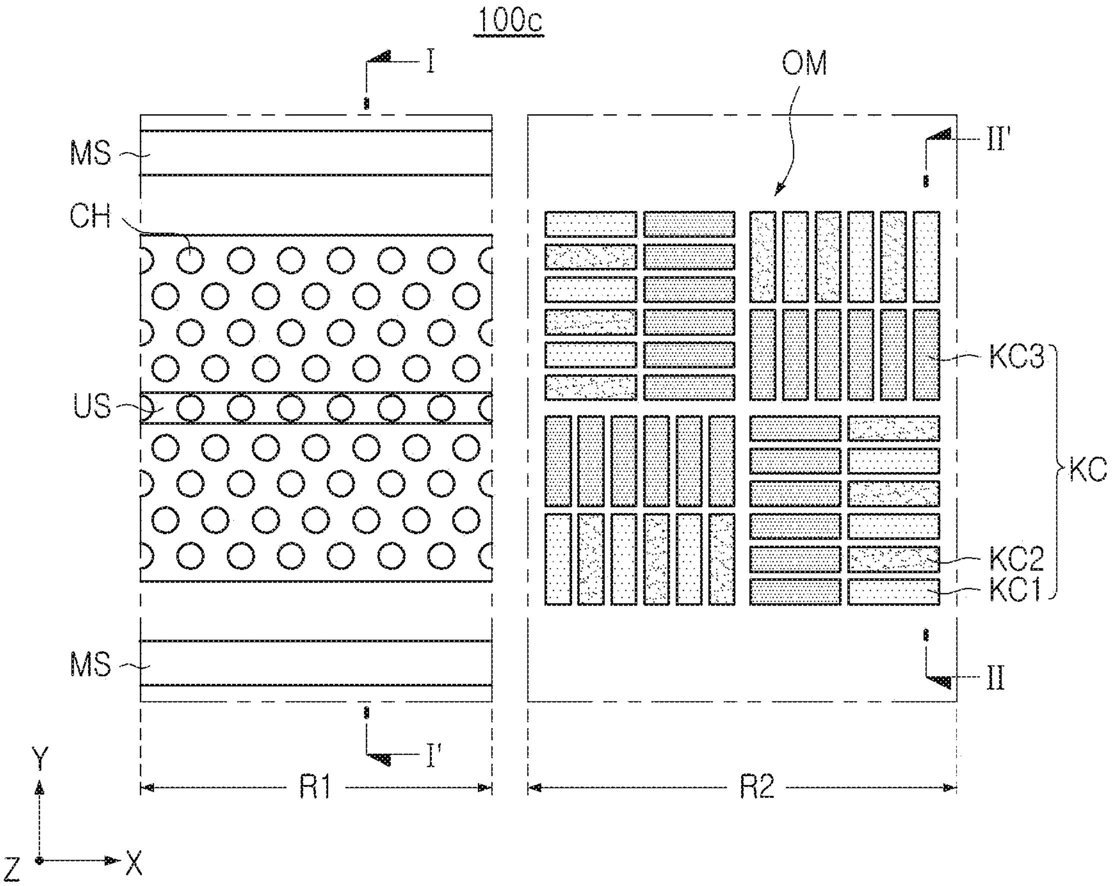
FIG. 5A is a plan diagram illustrating a semiconductor device according to an example embodiment of the present disclosure.

FIG. 5A is a plan diagram illustrating a semiconductor device according to an example embodiment.

Figure 5B:
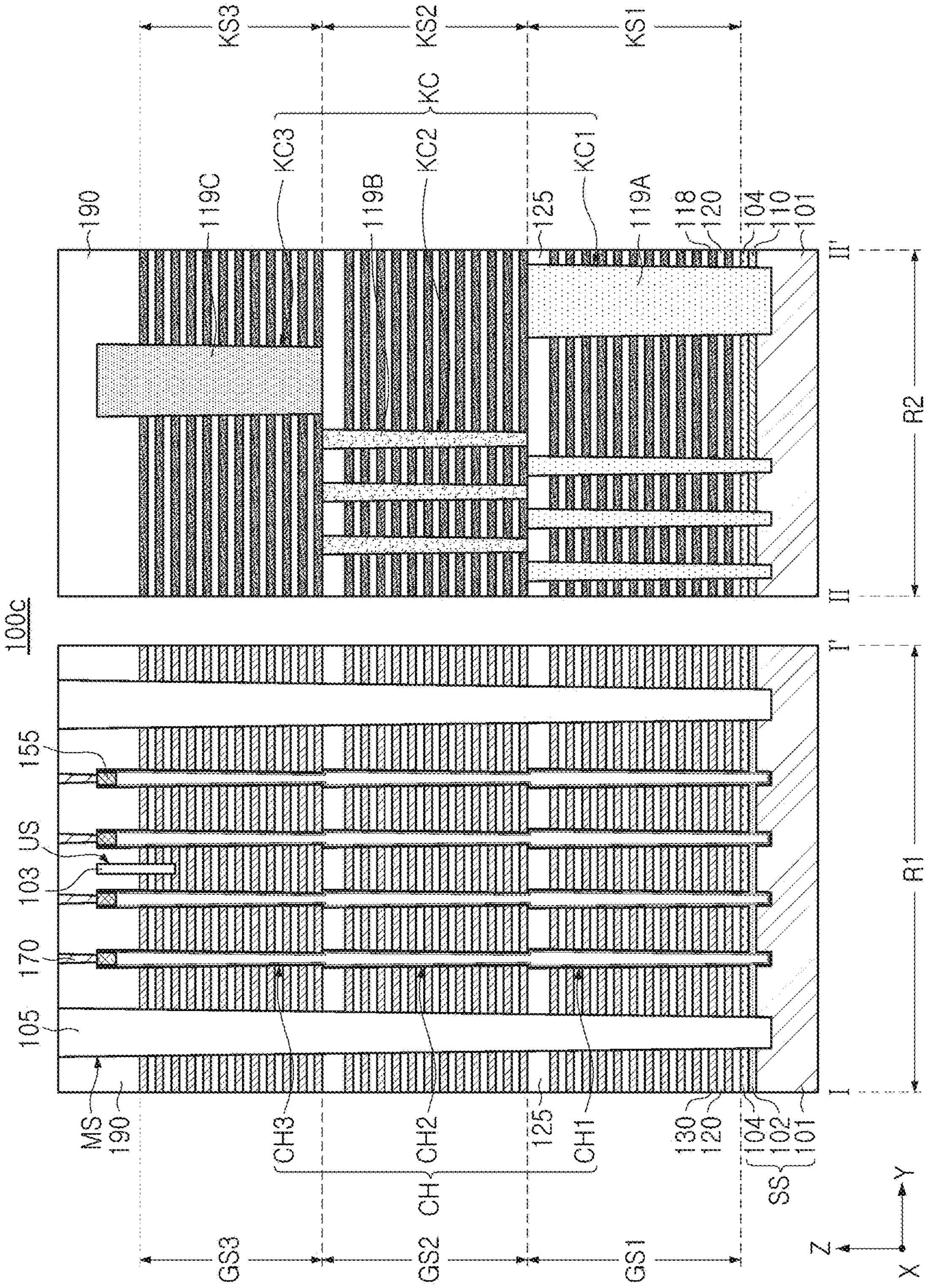
FIG. 5B is a cross-sectional diagram illustrating a semiconductor device according to an example embodiment of the present disclosure.

FIG. 5B is a cross-sectional diagram illustrating a semiconductor device according to an example embodiment, taken along lines I-I' and II-II' in FIG. 5A.

Referring to FIGS. 5A and 5B, as in FIG. 5A, in the semiconductor device 100*c*, the first and second overlay structures KC1 and KC2 may be alternately disposed in a quadrant in the overlay mark region OM, and the third overlay structures KC3 may be disposed consecutively with the same distance therebetween. According to an example embodiment, in the first quadrant, the first distance, which is the minimum horizontal distance between first overlay structures KC1 parallel to each other, may be substantially equal to the second distance, which is the minimum horizontal distance between the second overlay structures KC2 parallel to each other, and may be greater than the third distance, which is the minimum horizontal distance between the third overlay structures KC3 parallel to each other. That is, the first distance and the second distance may be substantially the same, and the first distance and the second distance may be greater than the third distance.

Figure 6:
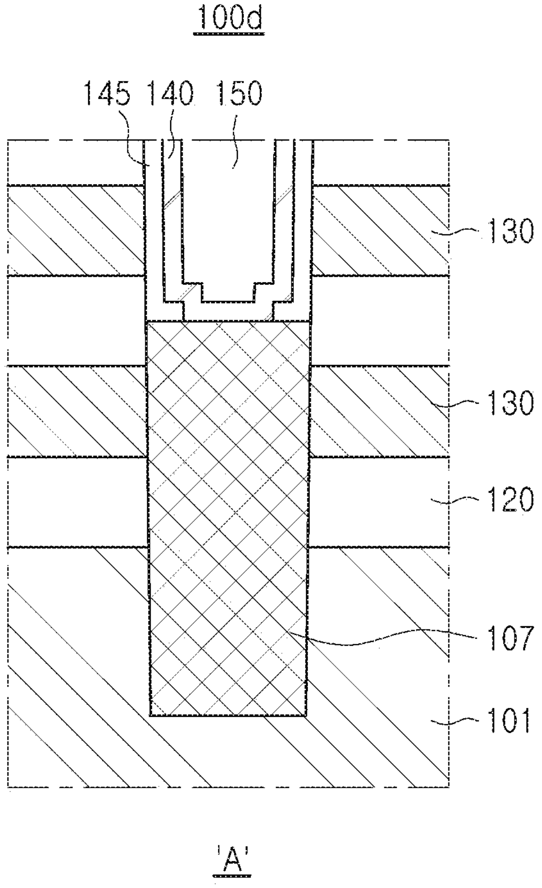
FIG. 6 is an enlarged diagram illustrating a partial region of a semiconductor device according to an example embodiment of the present disclosure.

FIG. 6 is an enlarged diagram illustrating a region of a semiconductor device according to an example embodiment, illustrating region "A" in FIG. 2A.

Differently from FIG. 2B, the lower structure of the first channel structures CH1 in the semiconductor device 100*d* may be different. The first channel structures CH1 may include an epitaxial layer 107, a channel layer 140, a gate dielectric layer 145, and a channel buried insulating layer 150. The epitaxial layer 107 may be disposed on the substrate 101 on the lower end of the first channel structures CH1 and may be disposed on the side surface of at least one gate electrode 130. An epitaxial layer 107 may be disposed in a recessed region of the substrate 101. A level of the upper surface of the epitaxial layer 107 may be higher than a level of the upper surface of the lowest gate electrode 130 and may be lower than a level of the lower surface of a gate electrode 130 immediately above the lowest gate electrode 130, but example embodiment thereof are not limited thereto. In some example embodiments, the epitaxial layer 107 may not be provided, and in such cases, the channel layer 140 may be directly connected to the substrate 101. The lower structure of the first channel structures CH1 as described above may also be applied to other example embodiments.

Figure 7A:
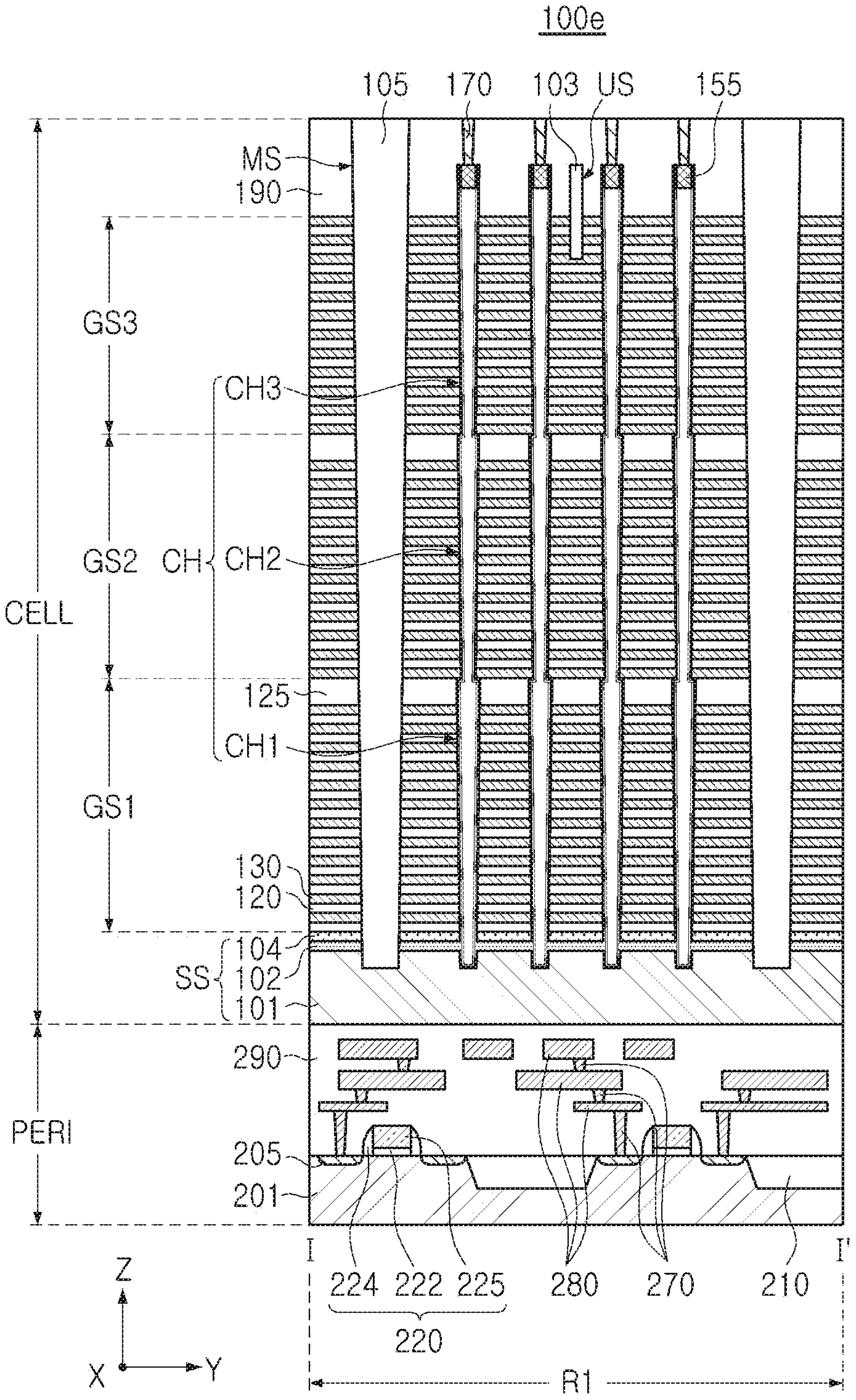
FIGS. 7A and 7B are cross-sectional diagrams illustrating a semiconductor device according to an example embodiment of the present disclosure.
Figure 7B:
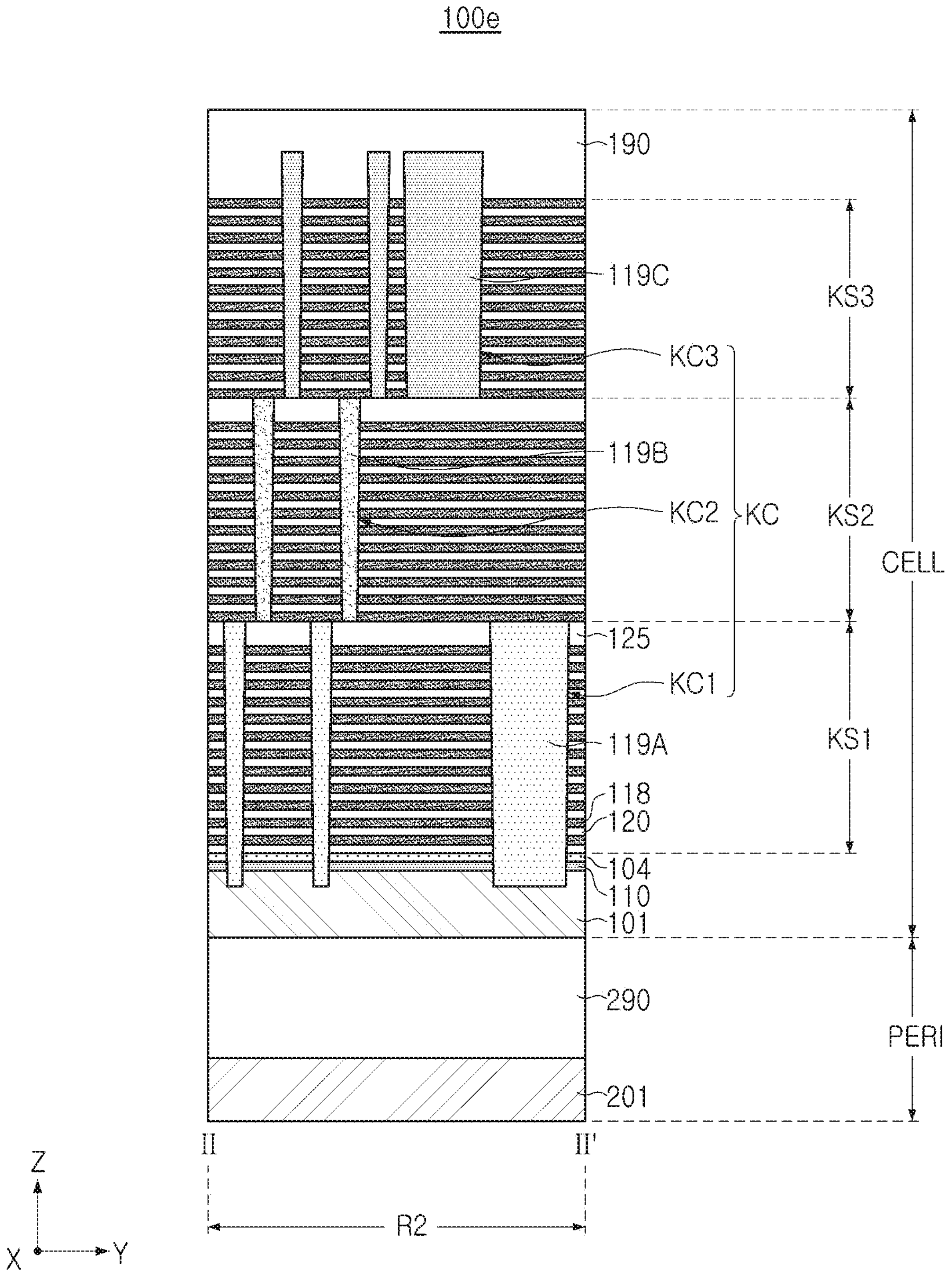

FIGS. 7A and 7B are cross-sectional diagrams illustrating a semiconductor device according to an example embodiment.

Referring to FIGS. 7A and 7B, a semiconductor device 100*e* may include a memory cell region CELL and a peripheral circuit region PERI stacked vertically. The memory cell region CELL may be disposed on the peripheral circuit region PERI. For example, in the case of the semiconductor device 100 in FIG. 2A, a peripheral circuit region PERI may be disposed on the substrate 101 in a region not illustrated, or a peripheral circuit region PERI may be disposed therebelow as in the semiconductor device 100*e* in this example embodiment. In this example embodiments, the cell region CELL may be disposed below the peripheral circuit region PERI. The description of the memory cell region CELL may be equally applied to the description in FIGS. 1A to 2B.

The peripheral circuit region PERI may include a base substrate 201, circuit devices 220, circuit contact plugs 270 and circuit interconnection lines 280 disposed on the base substrate 201.

The base substrate 201 may have an upper surface extending in the X-direction and the Y-direction. In the base substrate 201, device isolation layers 210 may be formed and an active region may be defined. Source/drain regions 205 including impurities may be disposed in a portion of the active region. The base substrate 201 may include a semiconductor material, such as a group IV semiconductor, a group III-V compound semiconductor, or a group II-VI compound semiconductor. The base substrate 201 may be provided as a bulk wafer or an epitaxial layer. In some example embodiments, the upper substrate 101 may be provided as a polycrystalline semiconductor layer such as a polycrystalline silicon layer or an epitaxial layer.

The circuit devices 220 may include planar transistors. Each of the circuit devices 220 may include a circuit gate dielectric layer 222, a spacer layer 224 and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate through the peripheral region insulating layer 290 and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit interconnection lines 280 may be connected to the circuit contact plugs 270 and may be disposed in a plurality of layers. In the peripheral circuit region PERI, the circuit device 220, the circuit contact plugs 270, and the circuit interconnection lines 280 may not be disposed below the second region R2, but example embodiments thereof are not limited thereto.

The memory cell region CELL and the peripheral circuit region PERI may be electrically connected to each other in regions not illustrated. For example, one end of the gate electrode 130 in the X-direction may be electrically connected to the circuit devices 220. As described above, the form in which the memory cell region CELL and the peripheral circuit region PERI are vertically stacked may also be applied to the example embodiments in FIGS. 1A to 6.

Figure 8A:
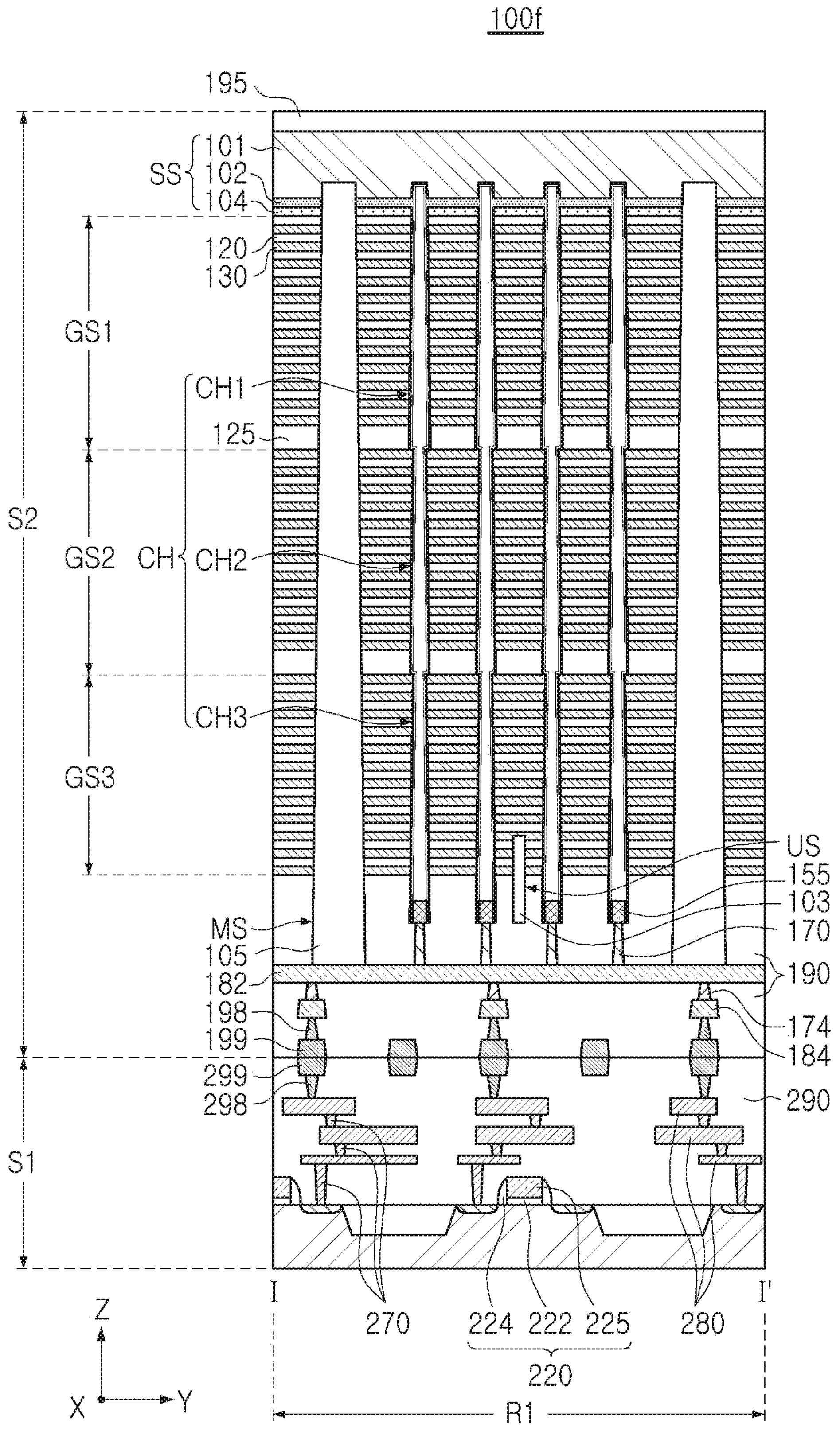
FIGS. 8A and 8B are cross-sectional diagrams illustrating a semiconductor device according to an example embodiment of the present disclosure.
Figure 8B:
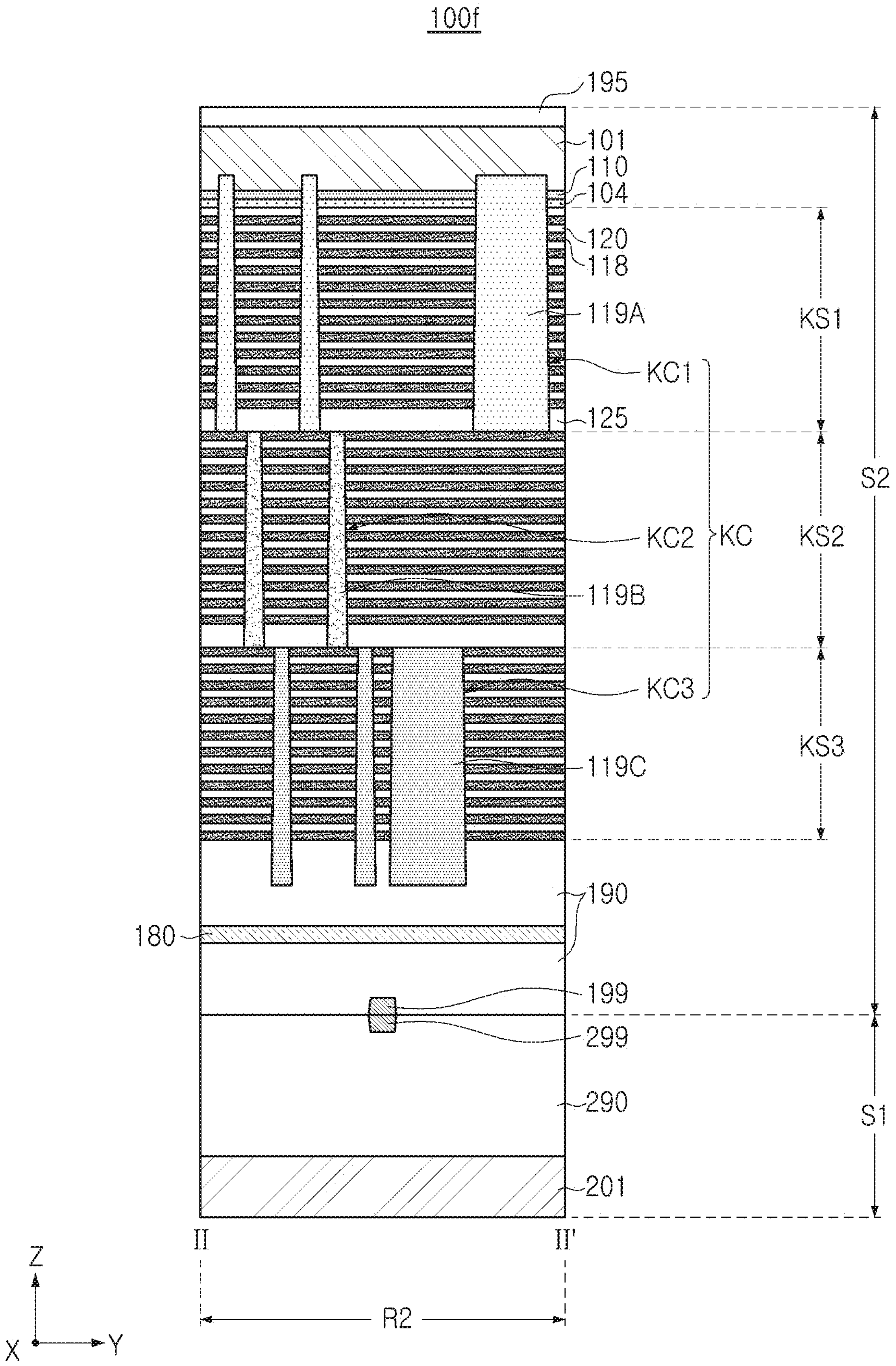

FIGS. 8A and 8B are cross-sectional diagrams illustrating a semiconductor device according to an example embodiment.

Referring to FIGS. 8A and 8B, a semiconductor device 100*f* may include a first semiconductor structure S1 and a second semiconductor structure S2 bonded to each other by a wafer bonding method.

The description of the peripheral circuit region PERI described above with reference to FIGS. 7A and 7B may be applied to the description of the first semiconductor structure S1. However, the first semiconductor structure S1 may further include first bonding vias 298 and first bonding pads 299, which are bonding structures. The first bonding vias 298 may be disposed above the uppermost portion of the circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 together with the second bonding pads 199 may provide an electrical connection path according to bonding of the first semiconductor structure S1 and the second semiconductor structure S2. The first bonding vias 298 and first bonding pads 299 may include a conductive material, for example copper (Cu).

As for the second semiconductor structure S2, the description described with reference to FIGS. 1A to 2B may be applied. The second semiconductor structure S2 may further include lower contact plugs 174 and first and second cell interconnection lines 182 and 184 which are interconnection structures, and may further include second bonding vias 198 and second bonding pads 199 which are bonding structures. The second semiconductor structure S2 may further include a passivation layer 195 covering an upper surface of the substrate 101.

The first cell interconnection lines 182 may be connected to the lower contact plugs 174, and the second cell interconnection lines 184 may be electrically connected to the first cell interconnection lines 182 by the lower contact plugs 174. The lower contact plugs 174 may be disposed between the first and second cell interconnection lines 182 and 184, and may connect the first and second cell interconnection lines 182 and 184 to each other. However, in example embodiments, the number of layers and arrangement of contact plugs and interconnection lines included in the interconnection structure may vary. The lower contact plugs 174 and the first and second cell interconnection lines 182 and 184 may be formed of a conductive material, and may include, for example, at least one of tungsten (W), aluminum (Al), and copper (Cu).

The second bonding vias 198 and the second bonding pads 199 may be disposed below the lowermost second cell interconnection lines 184. The second bonding vias 198 may be connected to the second cell interconnection lines 184 and the second bonding pads 199, and the second bonding pads 199 may be bonded to the first bonding pads 299 of the first semiconductor structure S1. The second bonding vias 198 and the second bonding pads 199 may include a conductive material, for example copper (Cu).

The first semiconductor structure S1 and the second semiconductor structure S2 may be bonded to each other by copper (Cu)-copper (Cu) bonding by first bonding pads 299 and second bonding pads 199. In addition to the copper Cu-copper Cu bonding, the first semiconductor structure S1 and the second semiconductor structure S2 may be further bonded to each other by dielectric-dielectric bonding. The dielectric-dielectric bonding may be bonding by dielectric layers forming a portion of each of the peripheral region insulating layer 290 and the cell region insulating layer 190 and surrounding of the first bonding pads 299 and the second bonding pads 199. Accordingly, the first semiconductor structure S1 and the second semiconductor structure S2 may be bonded to each other without an adhesive layer.

FIGS. 9A to 9H are cross-sectional diagrams illustrating a method of manufacturing a semiconductor device according to an example embodiment, illustrating a cross-sectional surface corresponding to FIG. 2A.

Figure 9A:
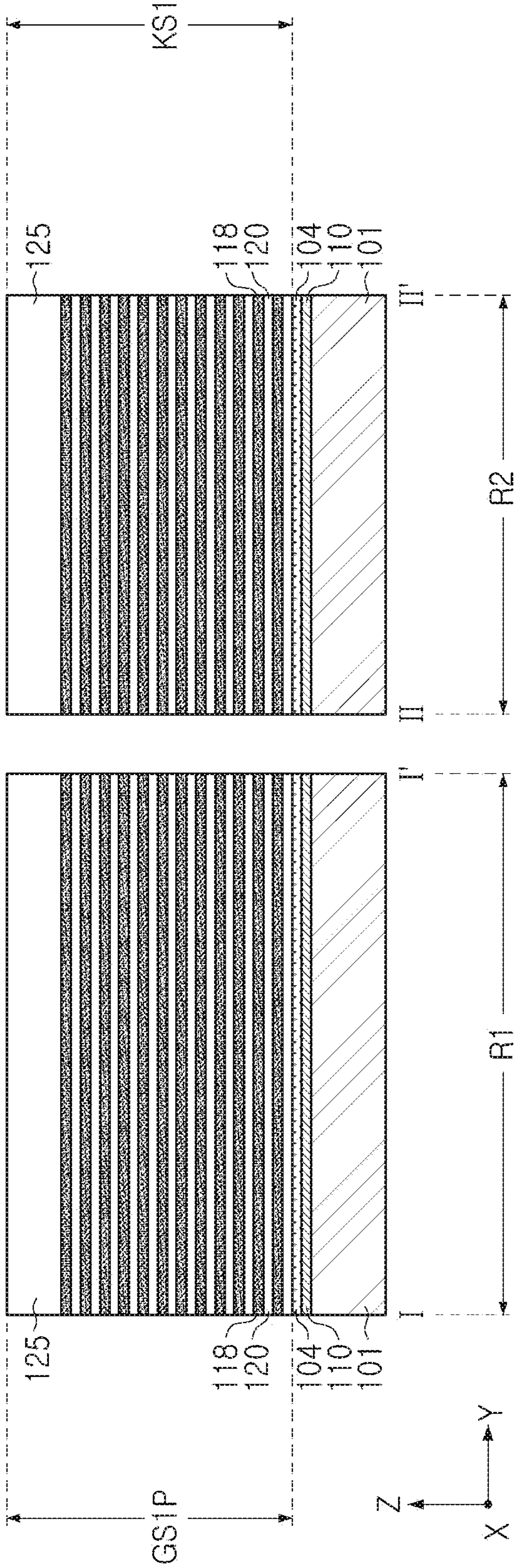
FIGS. 9A, 9B, 9C, 9D, 9E, 9F, 9G, and 9H are cross-sectional diagrams illustrating a method of manufacturing a semiconductor device according to an example embodiment of the present disclosure.

Referring to FIG. 9A, a horizontal insulating layer 110 and a second horizontal conductive layer 104 may be formed on a substrate 101, and first preliminary stack structure GS1*p* and first mold structure KS1 may be formed by alternately stacking horizontal sacrificial layers 118 and interlayer insulating layers 120.

The substrate 101 may have a first region R1 in which memory cells are formed and a second region R2 on the external side of the first region R1. The same process may be performed on the first and second regions R1 and R2.

The horizontal insulating layer 110 may include a plurality of layers including different materials. The horizontal insulating layer 110 may be replaced with the first horizontal conductive layer 102 (see FIG. 2A) through a subsequent process. For example, the horizontal insulating layer 110 may include a first layer and a third layer formed of the same material as that of the interlayer insulating layers 120, and may further include a second layer formed of the same material as that of the horizontal sacrificial layers 118 and disposed between the first layer and the third layer. A second horizontal conductive layer 104 may be formed on the horizontal insulating layer 110.

The horizontal sacrificial layers 118 may be replaced with gate electrodes 130 in the first region R1 in the first preliminary stack structure GS1*p*, through a subsequent process. The horizontal sacrificial layers 118 may be formed of a material different from that of the interlayer insulating layers 120, and may be formed of a material etched with etch selectivity under specific etching conditions with respect to the interlayer insulating layers 120. For example, the interlayer insulating layer 120 may be formed of at least one of silicon oxide and silicon nitride, and the horizontal sacrificial layers 118 may be formed of a material different from that of the interlayer insulating layer 120 selected from silicon, silicon oxide, silicon carbide, and silicon nitride. In some example embodiments, the interlayer insulating layers 120 may not have the same thickness. In some example embodiments, the thicknesses of the interlayer insulating layers 120 and the horizontal sacrificial layers 118 and the number of films forming the layers may vary from the illustrated examples.

An upper interlayer insulating layer 125 having a relatively thick thickness may be formed on an uppermost horizontal sacrificial layer 118.

Figure 9B:
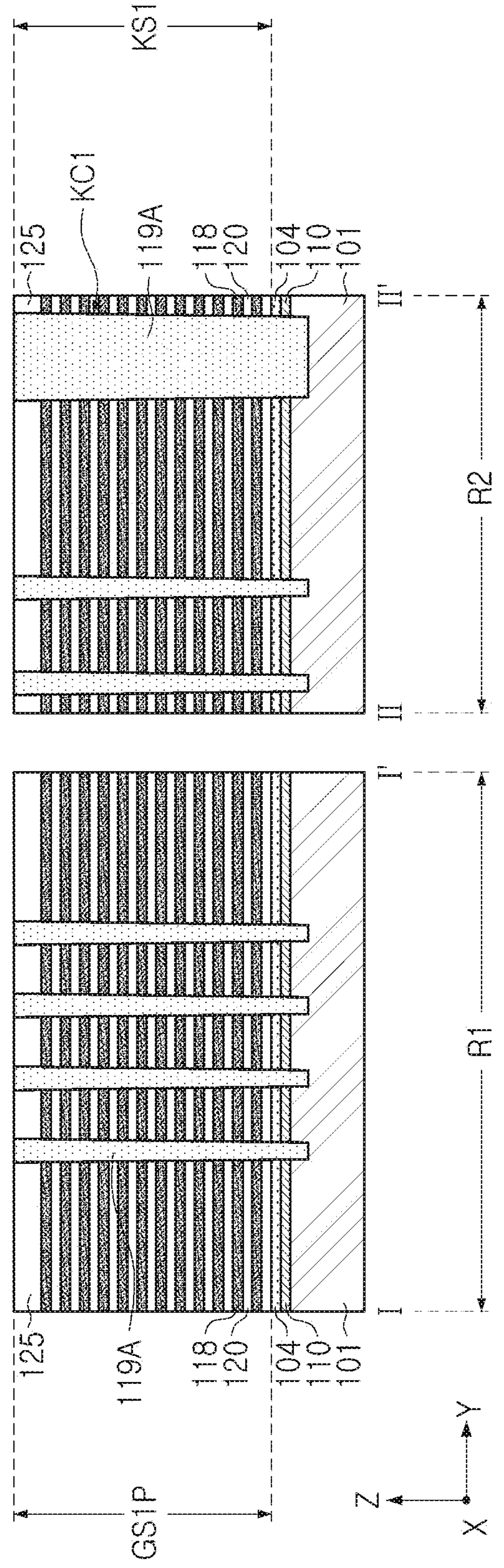

Referring to FIG. 9B, a portion of the upper interlayer insulating layers 125 may be removed, and first vertical sacrificial layers 119A penetrating through the first preliminary stack structure GS1*p* and the first mold structure KS1 may be formed.

A portion of the upper interlayer insulating layer 125 may be removed by a planarization process.

The first vertical sacrificial layers 119A may be formed in a region corresponding to the first channel structures CH1 and the first overlay structures KC1 in FIG. 2A, and may form the first overlay structures KC1 in the second region R2. The first vertical sacrificial layers 119A may be formed by forming first channel holes to penetrate through the first preliminary stack structure GS1*p* and the first mold structure KS1, depositing a material to form the first vertical sacrificial layers 119A on the first channel holes, and performing a planarization process. The first vertical sacrificial layers 119A may include a carbon-based material. However, in some example embodiments, the first vertical sacrificial layers 119A may include a semiconductor material such as polycrystalline silicon or a silicon-based insulating material.

Figure 9C:
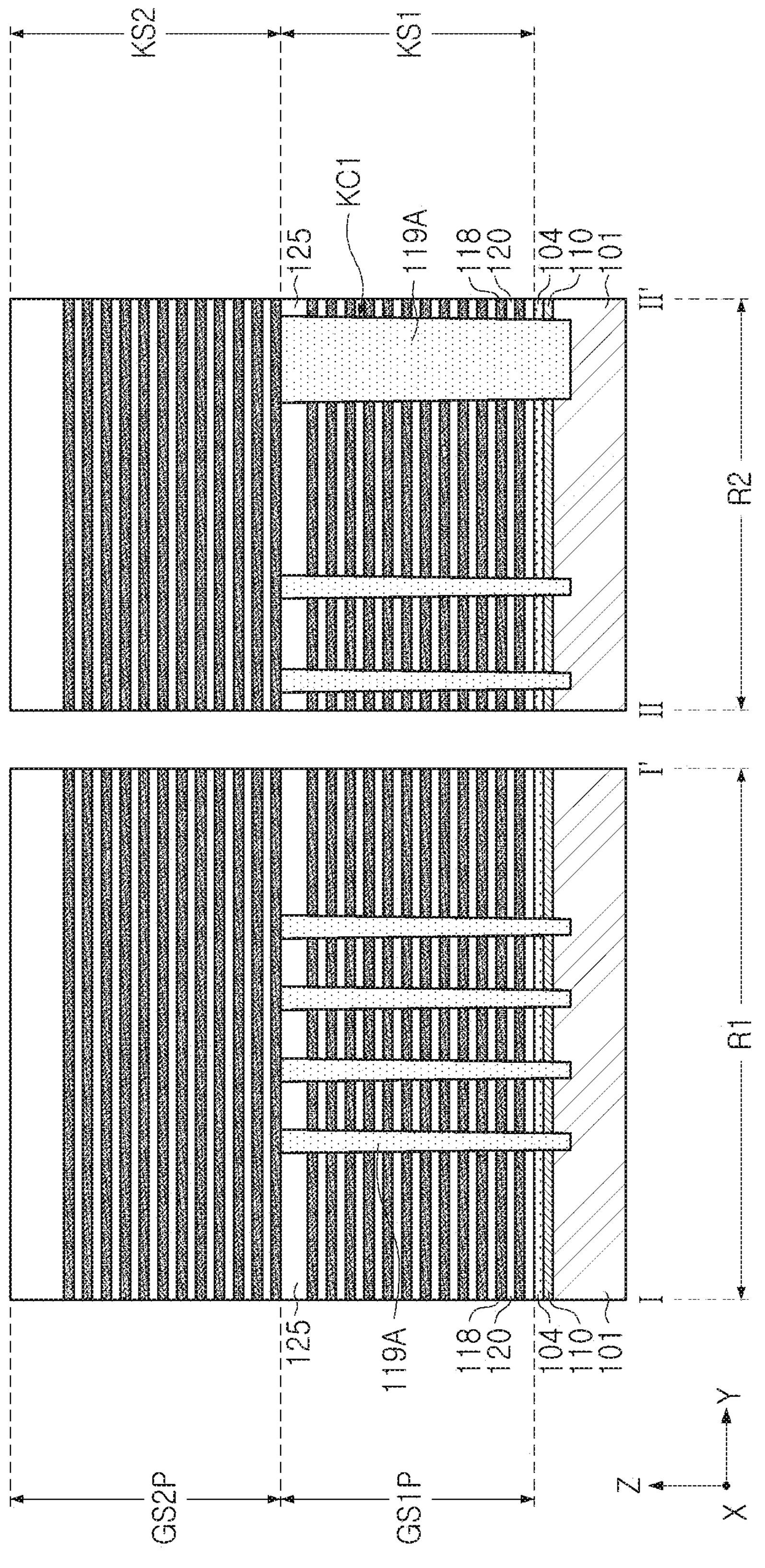

Referring to FIG. 9C, a second preliminary stack structure GS2*p* and a second mold structure KS2 may be formed by alternately stacking horizontal sacrificial layers 118 and interlayer insulating layers 120.

The second preliminary stack structure GS2*p* and the second mold structure KS2 may be formed by alternately stacking the horizontal sacrificial layers 118 and the interlayer insulating layers 120 similarly to the first preliminary stack structure GS1*p* and the first mold structure KS1.

An upper interlayer insulating layer 125 having a relatively thick thickness may be formed on an uppermost horizontal sacrificial layer 118.

Figure 9D:
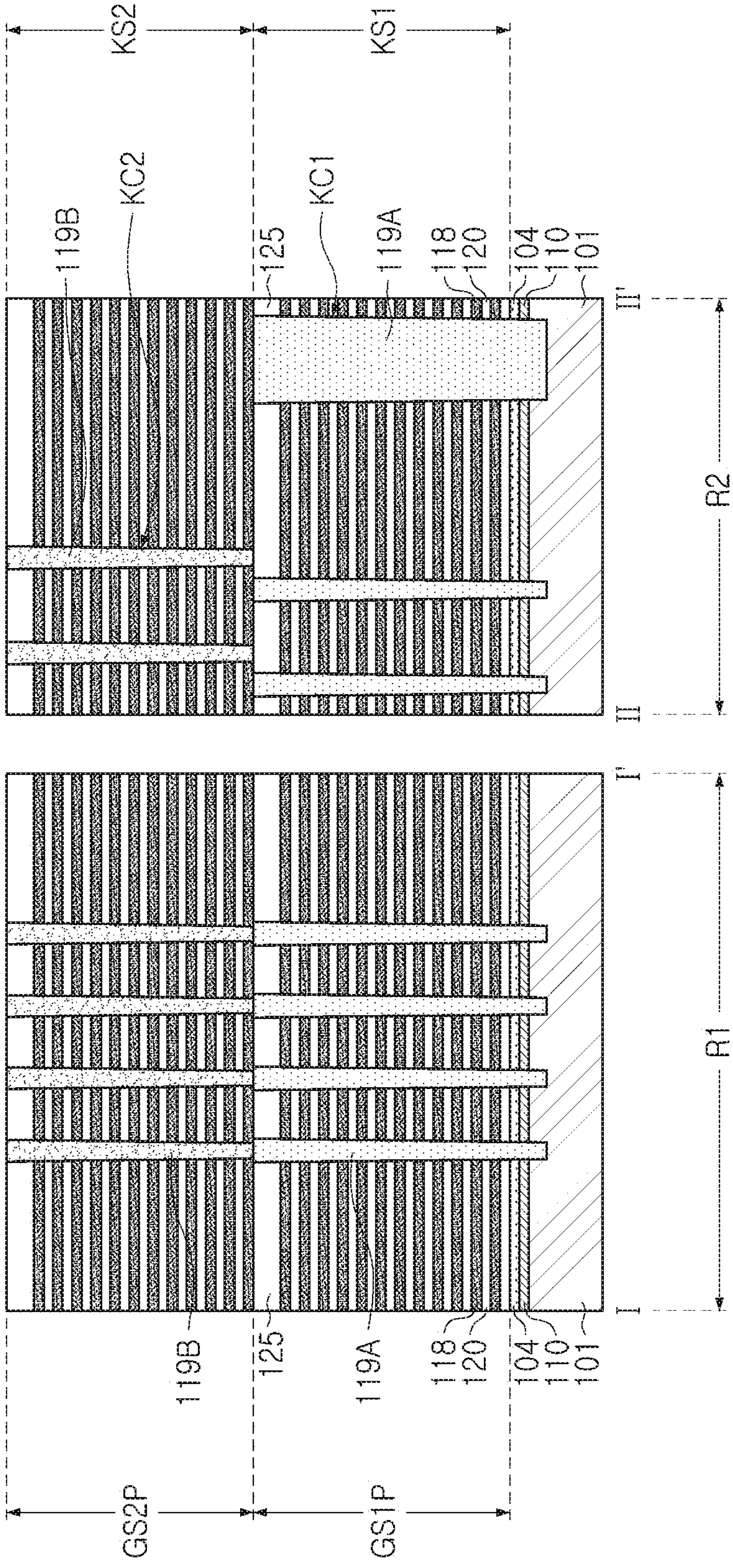

Referring to FIG. 9D, a portion of the upper interlayer insulating layers 125 may be removed, and second vertical sacrificial layers 119B penetrating through the second preliminary stack structure GS2*p* and the second mold structure KS2 may be formed.

A portion of the upper interlayer insulating layer 125 may be removed by a planarization process.

The second vertical sacrificial layers 119B may be formed in a region corresponding to the second channel structures CH2 and the second overlay structures KC2 in FIG. 2A, and may form the second overlay structures KC2 in the second region R2. The second vertical sacrificial layers 119B may be formed by forming second channel holes to penetrate the second preliminary stack structure GS2*p* and the second mold structure KS2, depositing a material to form the second vertical sacrificial layers 119B in the second channel holes, and performing a planarization process. In this process, in the photolithography process for forming the second channel holes, the first and second overlay structures KC1 and KC2 may perform a function of identifying the alignment of the first and second preliminary stack structures GS1*p* and GS2*p* and the first and second channel holes. The second vertical sacrificial layers 119B may include a carbon-based material. However, in some example embodiments, the second vertical sacrificial layers 119B may include a semiconductor material such as polycrystalline silicon or a silicon-based insulating material.

Figure 9E:
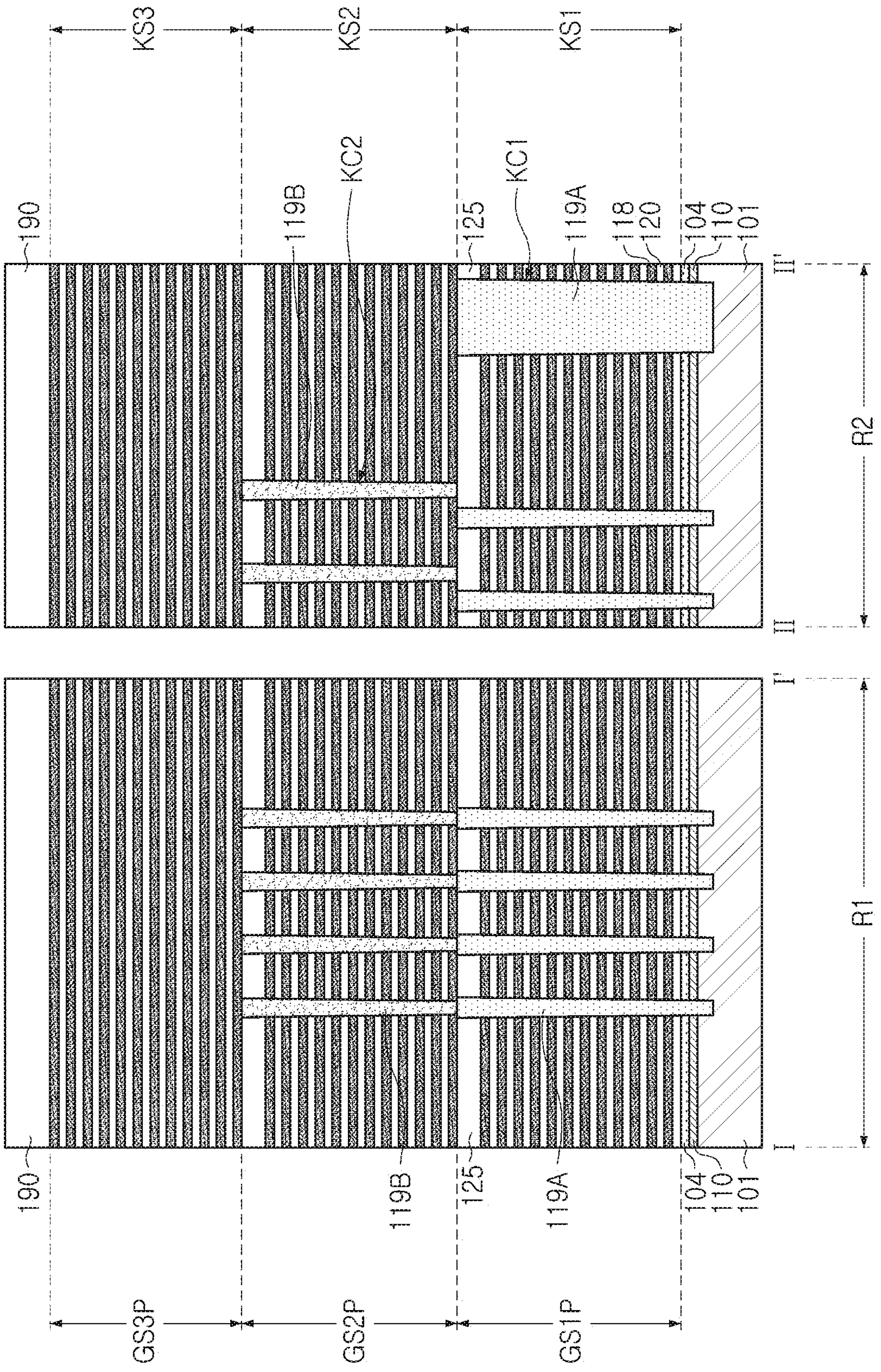

Referring to FIG. 9E, a third preliminary stack structure GS3*p* and a third mold structure KS3 may be formed by alternately stacking the horizontal sacrificial layers 118 and the interlayer insulating layers 120.

The third preliminary stack structure GS3*p* and the third mold structure KS3 may be formed by alternately stacking the horizontal sacrificial layers 118 and the interlayer insulating layers 120 similarly to the first preliminary stack structure GS1*p*, the first mold structure KS1, the second preliminary stack structure GS2*p* and the second mold structure KS2.

A portion of the cell region insulating layer 190 may be formed on the third preliminary stack structure GS3*p* and the third mold structure KS3. The portion of the cell region insulating layer 190 formed in this process may also be described as the interlayer insulating layer 120 included in the third preliminary stack structure GS3*p* and the third mold structure KS3.

Figure 9F:
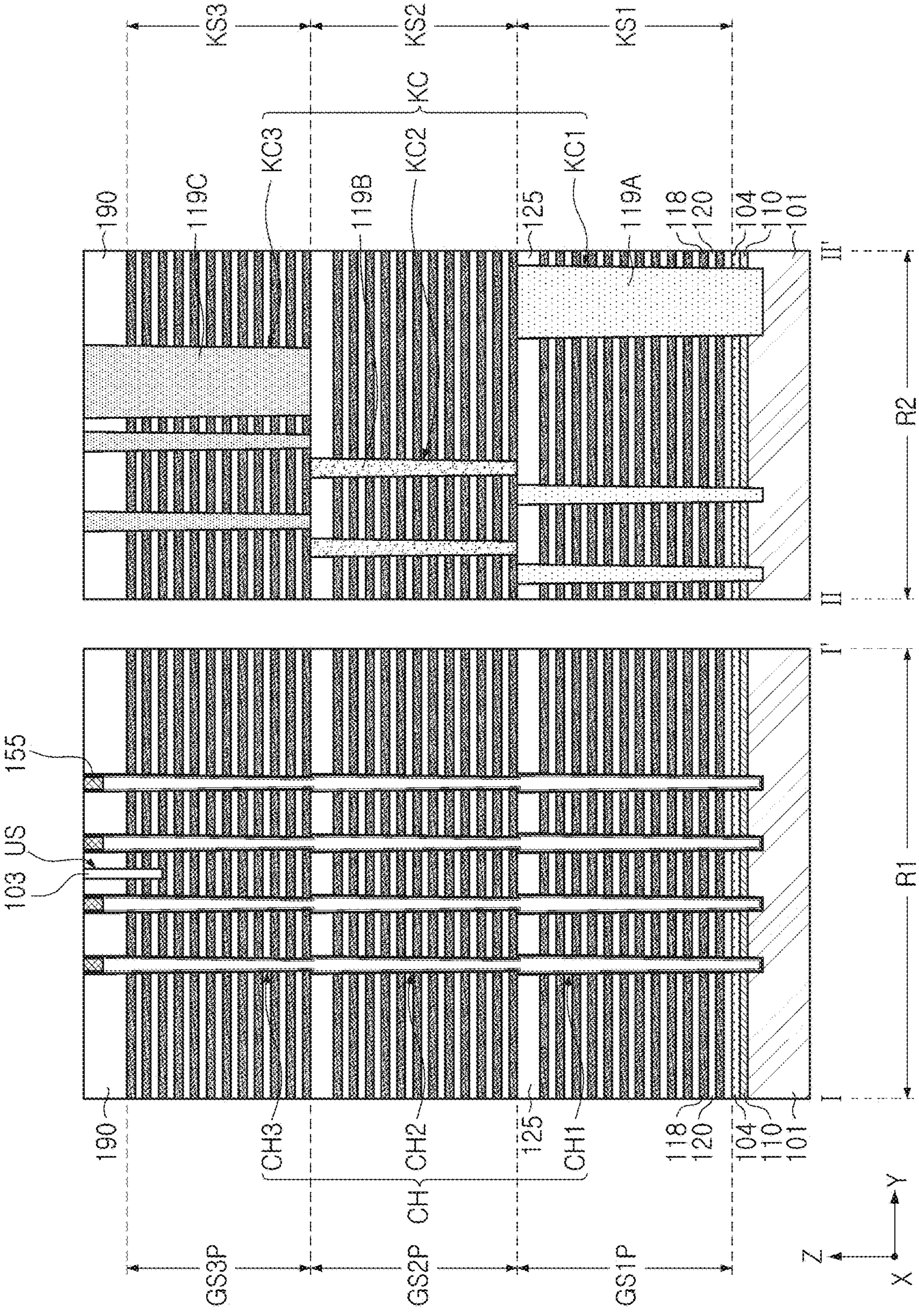

Referring to FIG. 9F, third channel holes penetrating through the third preliminary stack structure GS3*p* in first region R1 may be formed, the first and second vertical sacrificial layers 119A and 119B exposed through the third channel holes may be removed, and channel structures CH may be formed.

First, an upper isolation region US may be formed by removing a portion of the third preliminary stack structure GS3*p*. To form the upper isolation region US, a region in which the upper isolation region US is formed may be exposed using a mask layer, a desired (or alternatively, predetermined) number of the horizontal sacrificial layers 118 and the interlayer insulating layers 120 may be removed from an uppermost portion, an insulating material may be deposited, thereby forming an upper insulating layer 103.

Thereafter, the third channel holes may be formed on the first and second vertical sacrificial layers 119A and 119B to expose the upper surface of the second vertical sacrificial layers 119B. In this process, during the photolithography process for forming the third channel holes, the first to third overlay structures KC1, KC2, and KC3 may perform a function of identifying the alignment of the first to third preliminary stack structures GS1*p*, GS2*p*, and GS3*p* and first to third channel holes. Even in subsequent processes, the first to third overlay structures KC1, KC2, and KC3 may perform an alignment function. The first to third overlay structures KC1, KC2, and KC3 may be formed on the first to third mold structures KS1, KS2, and KS3 disposed on different levels, and may measure the degree of alignment in the X-direction and Y-direction, such that, in the overlay process, the alignment of three or more stack structures GS may be measured at once. In some example embodiments, when the process of forming the third channel holes and the process of forming the channel structures CH are not continuously performed, a process of filling the third vertical sacrificial layers 119C in the third channel holes may be further performed.

Thereafter, channel holes may be formed by removing the first and second vertical sacrificial layers 119A and 119B, and channel structures CH may be formed by filling the channel holes. For example, the channel structures CH may be formed by forming a gate dielectric layer 145, a channel layer 140, a channel buried insulating layer 150, and channel pads 155 in order in the channel holes. The channel layer 140 may be formed on the gate dielectric layer 145 in the channel structures CH. The channel buried insulating layer 150 may be formed to fill the channel structures CH and may be an insulating material. However, in some example embodiments, the space between the channel layers 140 may be filled with a conductive material instead of the channel buried insulating layer 150. The channel pads 155 may be formed of a conductive material, for example polycrystalline silicon. Accordingly, the channel structures CH including first channel structure CH1 in the first preliminary stack structure GS1*p*, second channel structure CH2 in the second preliminary stack structure GS2*p*, and third channel structure CH3 in the third preliminary stack structure GS3*p* may be formed.

Figure 9G:
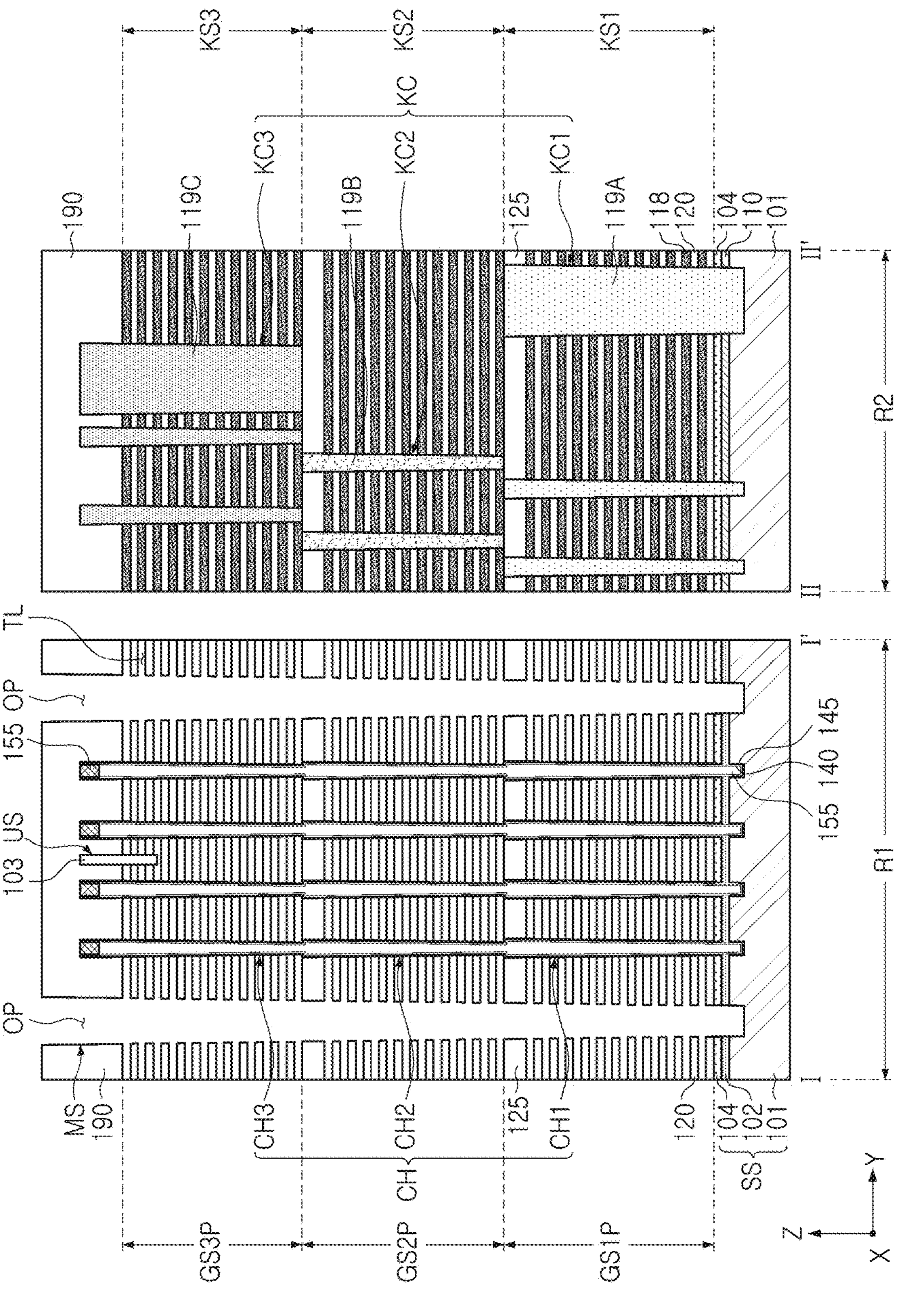

Referring to FIG. 9G, openings OP penetrating through the first to third preliminary stack structures GS1*p*, GS2*p*, and GS3*p* and extending to the substrate 101 may be formed in the first region R1, a first horizontal conductive layer 102 may be formed, and a horizontal sacrificial layer 118 may be removed.

First, a cell region insulating layer 190 may be further formed, and openings OP may be formed in a position corresponding to the isolation regions MS in FIG. 1A in the first region R1. Thereafter, a sacrificial spacer layers may be formed in the openings OP and an etch-back process may be performed, thereby exposing the horizontal insulating layer 110 in the first region R1 and the horizontal insulating layer 110 may be removed from the exposed region. The horizontal insulating layer 110 may be removed by, for example, a wet etching process. During the process of removing the horizontal insulating layer 110, a portion of the gate dielectric layer 145 exposed in the region from which the horizontal insulating layer 110 is removed may also be removed. In the first region R1, a first horizontal conductive layer 102 may be formed by depositing a conductive material in the region from which the horizontal insulating layer 110 is removed, and the sacrificial spacer layers may be removed from the openings OP. Through this process, a first horizontal conductive layer 102 may be formed in the first region R1, and a source structure SS including the substrate 101 and the first and second horizontal conductive layers 102 and 104 may be formed.

Thereafter, the horizontal sacrificial layers 118 may be selectively removed with respect to the interlayer insulating layers 120, the upper interlayer insulating layer 125, the protective layer 160, and the second horizontal conductive layer 104 using, for example, wet etching, thereby forming a tunnel portions TL. In this process, the openings OP may not be formed in the second region R2, such that the horizontal insulating layer 110 and the horizontal sacrificial layers 118 may remain.

Figure 9H:
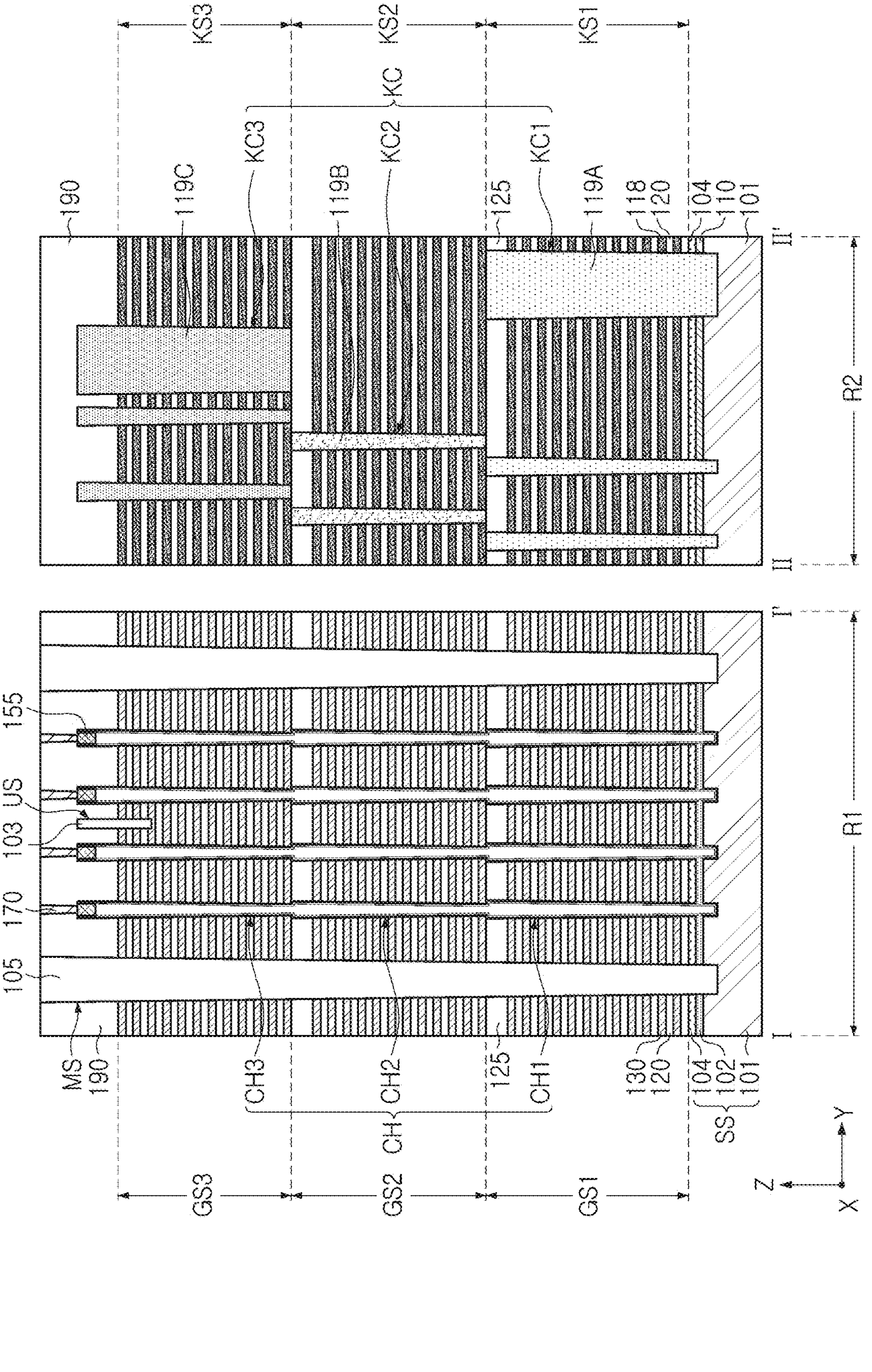

Referring to FIG. 9H, in first region R1, the gate electrodes 130 may be formed in tunnel portions TL, and an insulating layer 105 may be formed in the openings OP.

In first region R1, the gate electrodes 130 may be formed in the tunnel portions TL from which horizontal sacrificial layers 118 are removed. Accordingly, the first to third stack structures GS1, GS2, and GS3 including the gate electrodes 130 may be formed in the first region R1. When a portion of the gate dielectric layer 145 extends horizontally along the gate electrodes 130, a portion of the gate dielectric layer 145 may be formed before the gate electrodes 130 in this process. The gate electrodes 130 may include, for example, metal, polycrystalline silicon, or metal silicide as a conductive material.

After forming the gate electrodes 130, an isolation insulating layer 105 may be formed in the openings OP, thereby forming the isolation regions MS.

Thereafter, referring to FIG. 2A together, by forming contact plugs 170 connected to the channel structures CH in the first region R1, the semiconductor device 100 may be manufactured. Although not illustrated, an interconnection structure such as interconnection lines may be further formed on the contact plugs 170.

Figure 10:
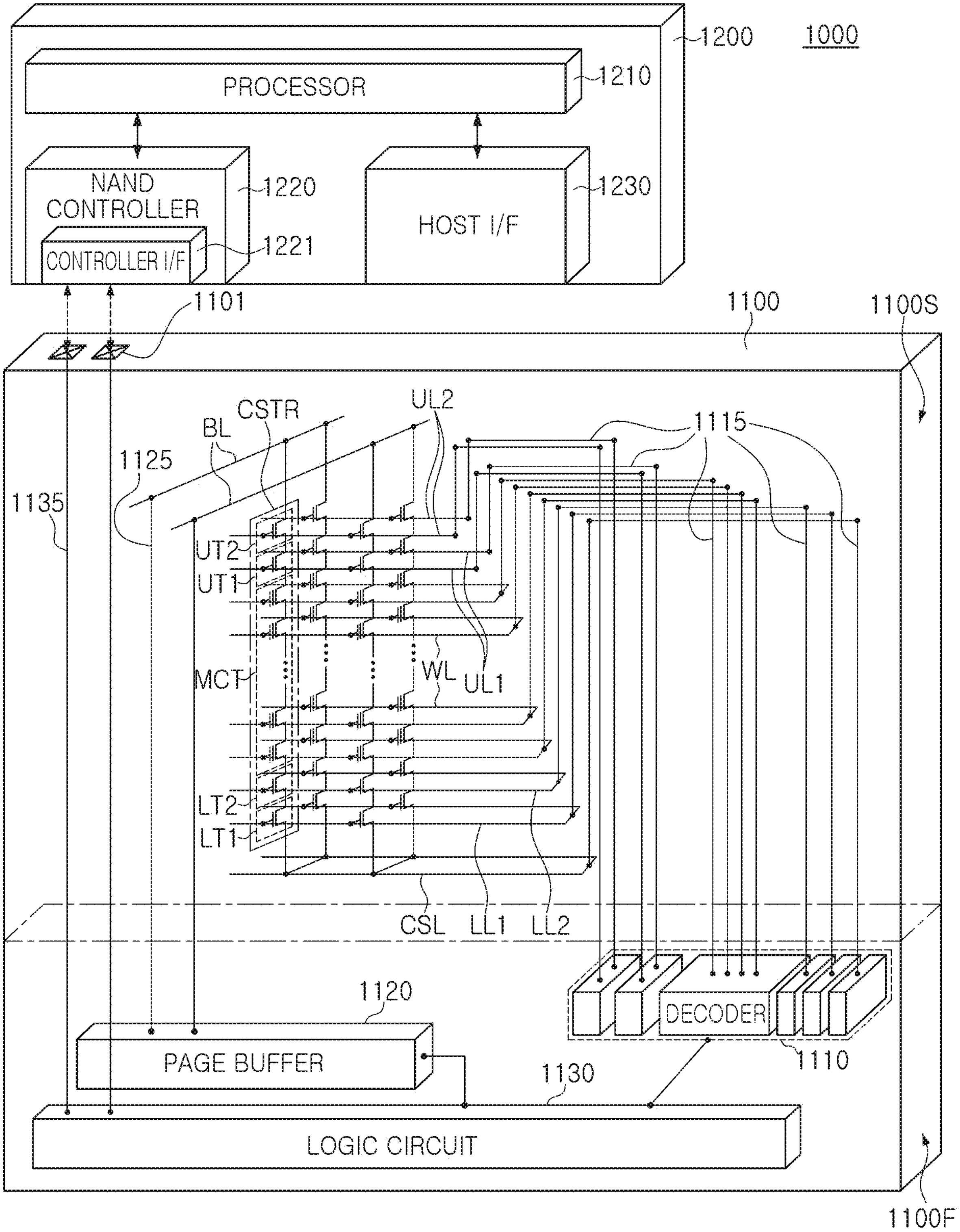
FIG. 10 is a diagram illustrating a data storage system including a semiconductor device according to an example embodiment of the present disclosure.

FIG. 10 is a diagram illustrating a data storage system including a semiconductor device according to an example embodiment.

Referring to FIG. 10, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiment with reference to FIGS. 1A to 8B. The semiconductor device 1100 may include a first structure 1100F and a second structure 1100S on the first structure 1100F. In some example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary depending on example embodiments.

The upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

The lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F to the second structure 1100S. The bit lines BL may be electrically connected to the page buffer 1120 through second connection interconnections 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pads 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In the example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a desired (or alternatively, predetermined) firmware, and may access the semiconductor device 1100 by controlling the NAND controller 1220. The NAND controller 1220 may include a controller interface 1221 processing communication with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 11:
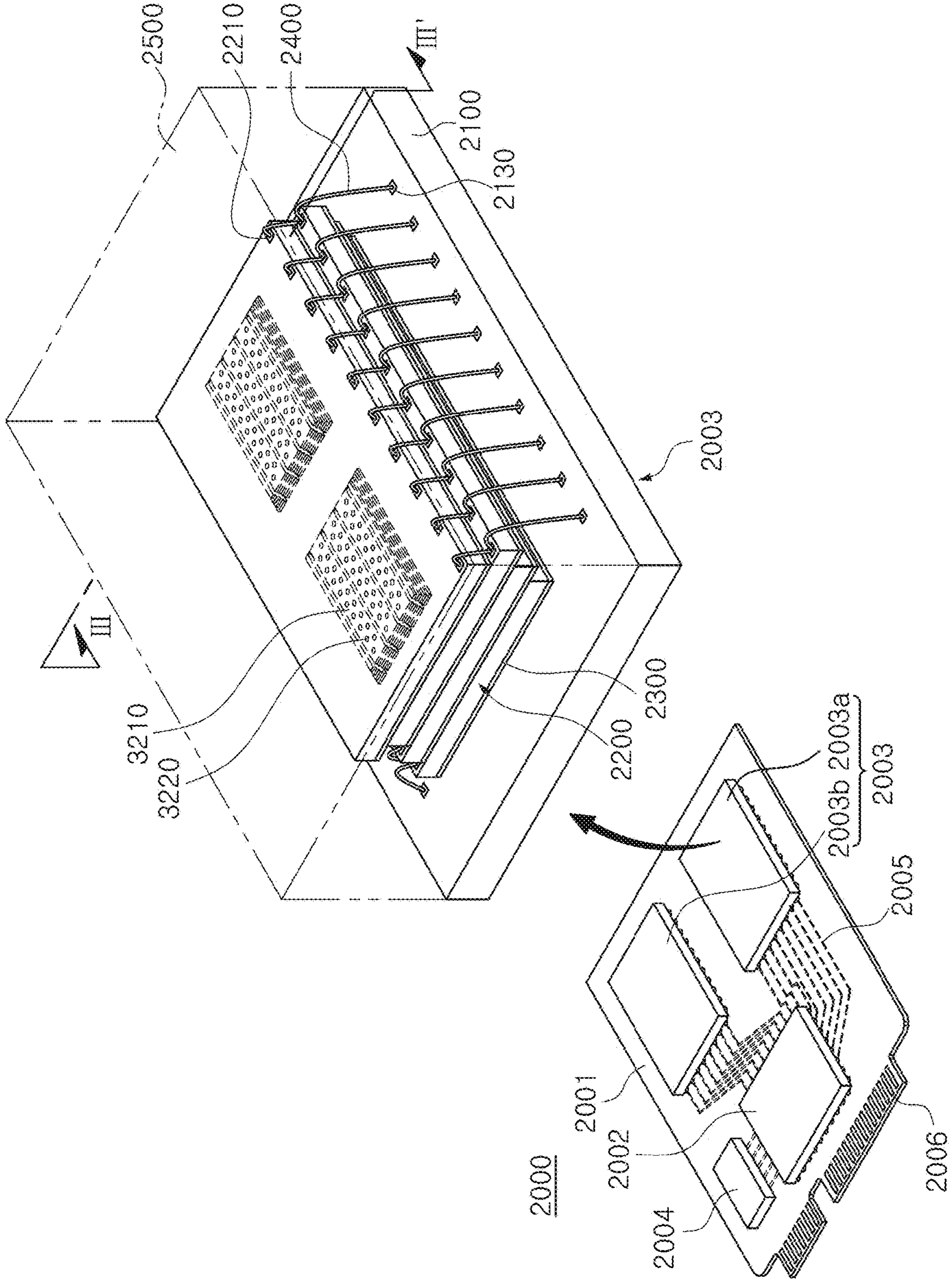
FIG. 11 is a perspective diagram illustrating a data storage system including a semiconductor device according to an example embodiment of the present disclosure.

FIG. 11 is a perspective diagram illustrating a data storage system including a semiconductor device according to an example embodiment.

Referring to FIG. 11 a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. The data storage system 2000 may communicate with an external host according to one of interfaces from among universal serial bus (USB), peripheral component interconnect express (PCI-Express), serial advanced technology attachment (SATA), M-Phy for universal flash storage (UFS). In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 10. Each of the semiconductor chips 2200 may include gate stack structures 3210 and channel structures 3220. Each of the semiconductor chips 2200 may include the semiconductor device described in the aforementioned example embodiment with reference to FIGS. 1A to 8B.

In some example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In some example embodiments, the controller 2002 and the semiconductor chips 2200 may be included in a single package. In some example embodiments, the controller 2002 and the semiconductor chips 2200 may be mounted on a separate interposer substrate different from the main board 2001, and the controller 2002 and the semiconductor chips 2200 may be connected to each other interconnection formed on the interposer substrate.

Figure 12:
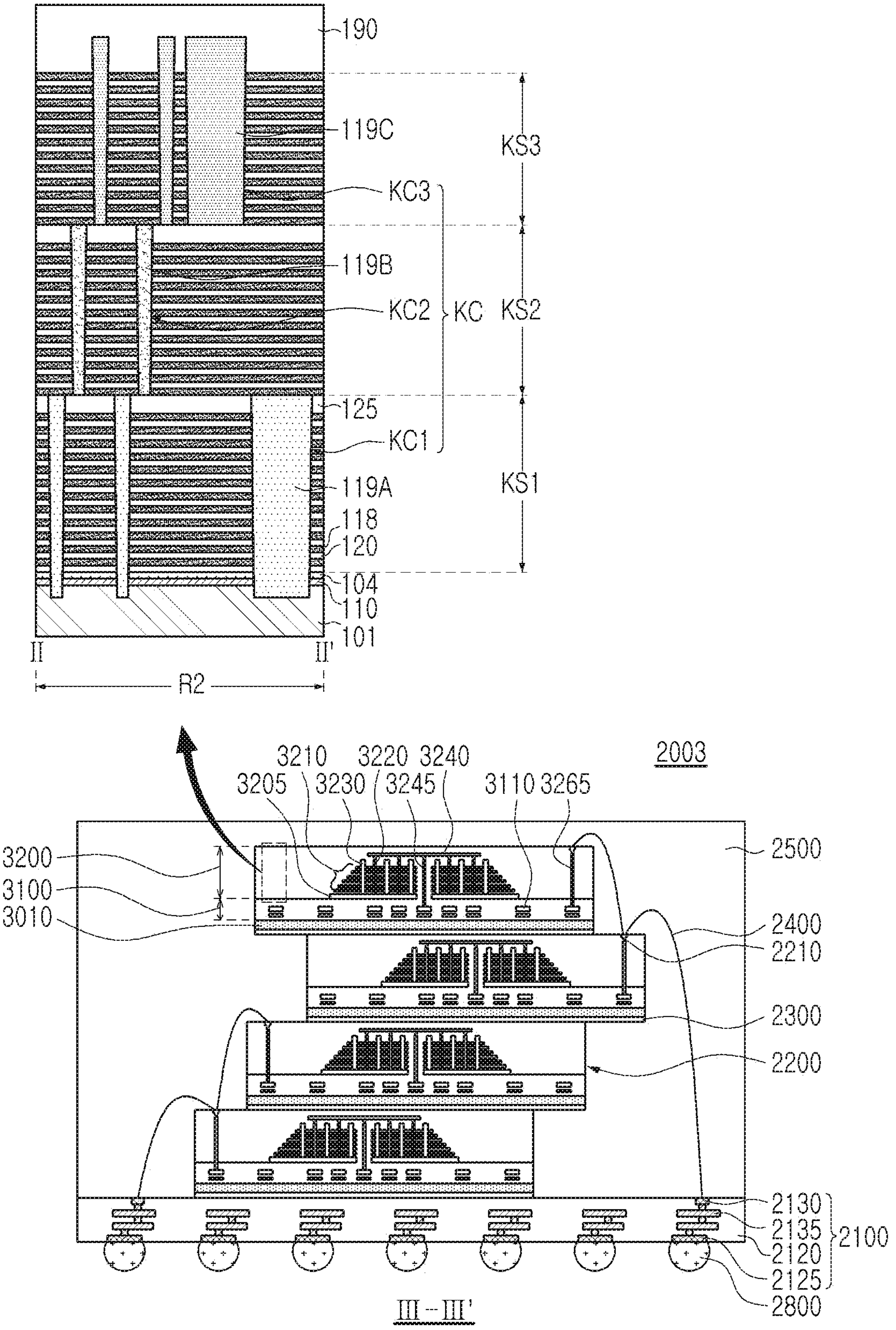
FIG. 12 is a cross-sectional diagram illustrating a semiconductor package according to an example embodiment of the present disclosure.

FIG. 12 is a cross-sectional diagram illustrating a semiconductor package according to an example embodiment, illustrating an example embodiment of the semiconductor package 2003 in FIG. 11 taken along line III-III'.

Referring to FIG. 12, in the semiconductor package 2003, the package substrate 2100 may be implemented as a printed circuit board. The package substrate 2100 may include a package substrate body 2120, package upper pads 2130 (see FIG. 11) disposed on the upper surface of the package substrate body 2120, lower pads 2125 disposed on the lower surface of the package substrate body 2120 or exposed through the lower surface, and internal interconnections 2135 electrically connecting the upper pads 2130 to the lower pads 2125 in the package substrate body 2120. The lower pads 2125 may be connected to the interconnection patterns 2005 of the main substrate 2001 of the data storage system 2000 as illustrated in FIG. 11 through conductive connection portions 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 penetrating through the gate stack structure 3210, bit lines 3240 electrically connected to the memory channel structures 3220, and contact plugs 3245 electrically connected to the word lines WL (see FIG. 10) of the gate stack structure 3210. As described in the aforementioned example embodiment with reference to FIGS. 1A to 8B, in each of the semiconductor chips 2200, in each of the semiconductor chips 2200, first to third overlay structures KC1, KC2, and KC3 for alignment and overlay during a manufacturing process may be disposed in one region of the substrate 101. Since the first to third overlay structures KC1, KC2, and KC3 may be formed on the first to third mold structures KS1, KS2, and KS3 disposed on different levels, and may measure the degree of alignment in the x and Y-directions, such that in the overlay process, the alignment of three or more stack structures GS may be measured at once.

Each of the semiconductor chips 2200 may include a through interconnection 3265 electrically connected to the peripheral interconnections 3110 of the first semiconductor structure 3100 and extending into the second semiconductor structure 3200. The through interconnection 3265 may be disposed on an external side of the gate stack structure 3210 and may be further disposed to penetrate through the gate stack structure 3210. Each of the semiconductor chips 2200 may further include input/output pads 2210 (see FIG. 11) electrically connected to the peripheral interconnections 3110 of the first semiconductor structure 3100.

According to the aforementioned example embodiments, by including overlay structures for measuring the alignment of a plurality of stack structures at once as a component, alignment accuracy may improve, and the area of scribe lanes may be reduced. Thus, a semiconductor device having improved integration density and reliability and a data storage system including the same may be provided.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be configured as apparent that modifications and variations could be made without departing from the scope of the present disclosure and the spirit and scope of the claims.

What is claimed is:

1. A semiconductor device, comprising:

a substrate having a first region and a second region;

a first stack structure including first gate electrodes stacked and spaced apart from each other in a vertical direction perpendicular to an upper surface of the substrate in the first region;

a first channel structure penetrating through the first stack structure and in contact with the substrate;

a second stack structure on the first stack structure and the first channel structure, the second stack structure including second gate electrodes stacked and spaced apart from each other in the vertical direction;

a second channel structure penetrating through the second stack structure and connected to the first channel structure;

a third stack structure on the second stack structure and the second channel structure, the third stack structure including third gate electrodes stacked and spaced apart from each other in the vertical direction;

a third channel structure penetrating through the third stack structure and connected to the second channel structure;

a first mold structure including first horizontal sacrificial layers stacked and spaced apart from each other in the vertical direction in the second region;

first overlay structures penetrating through at least a first portion of the first mold structure;

a second mold structure on the first mold structure and the first overlay structures, the second mold structure including second horizontal sacrificial layers stacked and spaced apart from each other in the vertical direction;

second overlay structures penetrating through at least a second portion of the second mold structure;

a third mold structure on the second mold structure and the second overlay structures, the third mold structure including third horizontal sacrificial layers stacked and spaced apart from each other in the vertical direction; and third overlay structures penetrating through at least a third portion of the third mold structure, wherein the first overlay structures, the second overlay structures, and the third overlay structures are in the first mold structure, the second mold structure and the third mold structure, respectively, and are on an overlay mark region, and wherein, in the overlay mark region, the first overlay structures, the second overlay structures, and the third overlay structures are in at least one of quadrants defined by a first direction parallel to the upper surface of the substrate and a second direction parallel to the upper surface of the substrate and intersecting the first direction.

2. The semiconductor device of claim 1, wherein the first direction and the second direction are perpendicular to each other, and wherein, in the at least one of the quadrants, the first overlay structures are parallel to each other, the second overlay structures are parallel to each other, and the third overlay structures are parallel to each other.

3. The semiconductor device of claim 1, wherein at least one of the first overlay structures, the second overlay structures, and the third overlay structures has a dot shape on a plan diagram.

4. The semiconductor device of claim 1, wherein, in a first quadrant among the quadrants, each of the first overlay structures, the second overlay structures, and the third overlay structures extends in the first direction, and wherein, in a second quadrant adjacent to the first quadrant among the quadrants, each of the first overlay structures, the second overlay structures, and the third overlay structures extends in the second direction.

5. The semiconductor device of claim 1, wherein, in the at least one of the quadrants, the first overlay structures, the second overlay structures, and the third overlay structures are spaced apart from each other with a same distance therebetween.

6. The semiconductor device of claim 1, wherein, in the at least one of the quadrants, a first distance, which is a first minimum horizontal distance between the first overlay structures parallel to each other, is same as a second distance, which is a minimum horizontal distance between the second overlay structures parallel to each other, and a third distance, which is a second minimum horizontal distance between the third overlay structures parallel to each other.

7. The semiconductor device of claim 1, wherein, in the at least one of the quadrants, a first distance, which is a first minimum horizontal distance between the first overlay structures parallel to each other, is same as a second distance, which is a second minimum horizontal distance between the second overlay structures parallel to each other, and is greater than a third distance, which is a third minimum horizontal distance between the third overlay structures parallel to each other.

8. The semiconductor device of claim 1, wherein, in at least one of the quadrants, the first overlay structures, the second overlay structures, and the third overlay structures are alternately disposed.

9. The semiconductor device of claim 1, wherein, in the at least one of the quadrants, a fourth portion of each of the first overlay structures, the second overlay structures, and the third overlay structures extends in the first direction, and wherein a fifth portion of each of the first overlay structures, the second overlay structures, and the third overlay structures extends in the second direction.

10. The semiconductor device of claim 1, wherein the first overlay structures, the second overlay structures, and the third overlay structures do not vertically overlap each other.

11. The semiconductor device of claim 1, wherein first upper surfaces of the first channel structure, the second channel structure and the third channel structure are coplanar with second upper surfaces of the first overlay structures, the second overlay structures, and the third overlay structures, respectively.

12. The semiconductor device of claim 1, wherein first upper surfaces of the first overlay structures are coplanar with first lower surfaces of the second overlay structures, and second upper surfaces of the second overlay structures are coplanar with second lower surfaces of the third overlay structures.

13. The semiconductor device of claim 1, wherein the first overlay structures, the second overlay structures, and the third overlay structures are spaced apart from each other when viewed in the vertical direction.

14. A semiconductor device, comprising:

a substrate having a first region and a second region;

a first stack structure including first gate electrodes stacked and spaced apart from each other in a vertical direction perpendicular to an upper surface of the substrate in the first region;

a first channel structure penetrating through the first stack structure and in contact with the substrate;

a second stack structure on the first stack structure and the first channel structure, the second stack structure including second gate electrodes stacked and spaced apart from each other in the vertical direction;

a second channel structure penetrating through the second stack structure and connected to the first channel structure;

a third stack structure on the second stack structure and the second channel structure, the third stack structure including third gate electrodes stacked and spaced apart from each other in the vertical direction;

a third channel structure penetrating through the third stack structure and connected to the second channel structure;

a first mold structure including first horizontal sacrificial layers stacked and spaced apart from each other in the vertical direction in the second region;

first overlay structures penetrating through at least a first portion of the first mold structure;

a second mold structure on the first mold structure and the first overlay structures, the second mold structure including second horizontal sacrificial layers stacked and spaced apart from each other in the vertical direction;

second overlay structures penetrating through at least a second portion of the second mold structure;

a third mold structure on the second mold structure and the second overlay structures, the third mold structure including third horizontal sacrificial layers stacked and spaced apart from each other in the vertical direction; and third overlay structures penetrating through at least a third portion of the third mold structure, wherein the first overlay structures, the second overlay structures, and the third overlay structures are in the first mold structure, the second mold structure, and the third mold structure, respectively, and are on an overlay mark region, and are in at least one quadrant with respect to a central point of the overlay mark region, wherein a fourth portion of the first overlay structures extends in a first direction parallel to the upper surface of the substrate, and a fifth portion of the first overlay structures extends in second direction perpendicular to the vertical direction, wherein a sixth portion of the second overlay structures extends in the first direction, and a seventh portion of the second overlay structures extends in the second direction, and wherein an eighth portion of the third overlay structures extends in the first direction, and a ninth portion of the third overlay structures extends in the second direction.

15. The semiconductor device of claim 14, wherein a cross-sectional surface of at least one of the first overlay structures, the second overlay structures, and the third overlay structures taken in the first direction and the second direction has a dot shape.

16. The semiconductor device of claim 14, wherein, in the at least one quadrant, a first distance, which is a first minimum horizontal distance between the first overlay structures parallel to each other, is same as a second distance, which is a second minimum horizontal distance between the second overlay structures parallel to each other, and a third distance, which is a third minimum horizontal distance between the third overlay structures parallel to each other.

17. The semiconductor device of claim 14, wherein, in the at least one quadrant, the first overlay structures, the second overlay structures, and the third overlay structures are alternately disposed.

18. The semiconductor device of claim 14, wherein a number of the first overlay structures, a first number of the second overlay structures and a second number of the third overlay structures are same.

19. A data storage system, comprising:

a semiconductor storage device including a substrate having a first region and a second region, circuit devices on one side of the substrate, and input/output pad electrically connected to the circuit devices; and a controller electrically connected to the semiconductor storage device through the input/output pad and configured to control the semiconductor storage device, wherein the semiconductor storage device includes, a first stack structure including first gate electrodes stacked and spaced apart from each other in a vertical direction perpendicular to an upper surface of the substrate in the first region, a first channel structure penetrating through the first stack structure and in contact with the substrate, a second stack structure on the first stack structure and the first channel structure, the second stack structure including second gate electrodes stacked and spaced apart from each other in the vertical direction, a second channel structure penetrating through the second stack structure and connected to the first channel structure, a third stack structure on the second stack structure and the second channel structure, the third stack structure including third gate electrodes stacked and spaced apart from each other in the vertical direction, a third channel structure penetrating through the third stack structure and connected to the second channel structure, a first mold structure including first horizontal sacrificial layers stacked and spaced apart from each other in the vertical direction in the second region, first overlay structures penetrating through at least a first portion of the first mold structure, a second mold structure on the first mold structure and the first overlay structures, the second mold structure including second horizontal sacrificial layers stacked and spaced apart from each other in the vertical direction, second overlay structures penetrating through at least a second portion of the second mold structure, a third mold structure on the second mold structure and the second overlay structures, the third mold structure including third horizontal sacrificial layers stacked and spaced apart from each other in the vertical direction, and third overlay structures penetrating through at least a third portion of the third mold structure, wherein the first overlay structures, the second overlay structures, and the third overlay structures are in the first mold structure, the second mold structure, and the third mold structure, respectively, and wherein the first overlay structures, the second overlay structures, and the third overlay structures are in at least one of quadrants defined by a first direction parallel to the upper surface of the substrate and a second direction parallel to the upper surface of the substrate and intersecting the first direction.

20. The data storage system of claim 19, wherein a fourth portion of the first overlay structures extends in the first direction, and a fifth portion of the first overlay structures extends in the second direction, wherein a sixth portion of the second overlay structures extends in the first direction, and a seventh portion of the second overlay structures extends in the second direction, and wherein an eighth portion of the third overlay structures extends in the first direction, and a ninth portion of the third overlay structures extends in the second direction.

* * * * *